(12) United States Patent
Jenne et al.

(10) Patent No.: US 7,283,384 B1
(45) Date of Patent: Oct. 16, 2007

(54) MAGNETIC MEMORY ARRAY ARCHITECTURE

(75) Inventors: Fredrick B. Jenne, Los Gatos, CA (US); Eugene Y. Chen, Fremont, CA (US); Thomas M. Mnich, Woodland Park, CO (US); William L. Stevenson, Redwood City, CA (US)

(73) Assignee: Silicon Magnetic Systems, San Jose, CA (US)

(*) Notice: Subject to any disclaimer, the term of this patent is extended or adjusted under 35 U.S.C. 154(b) by 199 days.

(21) Appl. No.: 10/809,134

(22) Filed: Mar. 24, 2004

(51) Int. Cl.
*G11C 11/00* (2006.01)

(52) U.S. Cl. .................. 365/158; 365/171; 365/55

(58) Field of Classification Search ............... 365/158, 365/171, 55, 66
See application file for complete search history.

(56) References Cited

U.S. PATENT DOCUMENTS

| | | | |
|---|---|---|---|
| 5,914,895 A | 6/1999 | Jenne | |
| 5,986,932 A | 11/1999 | Ratnakumar et al. | |
| 6,172,907 B1 | 1/2001 | Jenne | |
| 6,418,046 B1 | 7/2002 | Naji | |
| 6,611,454 B2* | 8/2003 | Hidaka | 365/171 |
| 6,683,806 B2* | 1/2004 | Drewes | 365/158 |
| 6,683,815 B1* | 1/2004 | Chen et al. | 365/225.5 |
| 6,778,430 B2 | 8/2004 | Hidaka | |
| 6,798,691 B1* | 9/2004 | Ounadjela et al. | 365/171 |
| 6,888,742 B1* | 5/2005 | Nguyen et al. | 365/158 |
| 6,947,315 B2* | 9/2005 | Iwata | 365/158 |
| 6,999,339 B2* | 2/2006 | Tuttle et al. | 365/158 |
| 2004/0012994 A1* | 1/2004 | Slaughter et al. | 365/158 |
| 2004/0114443 A1* | 6/2004 | Ezaki et al. | 365/200 |
| 2004/0141368 A1* | 7/2004 | Inaba | 365/158 |
| 2004/0233755 A1* | 11/2004 | Bessho et al. | 365/221 |

* cited by examiner

*Primary Examiner*—Huan Hoang
(74) *Attorney, Agent, or Firm*—Kevin L. Daffer; Mollie E. Lettang; Daffer McDaniel, LLP

(57) ABSTRACT

An MRAM device is provided which includes an array of magnetic elements, a plurality of conductive lines configured to set magnetization states of the magnetic elements and circuitry configured to vary current applications along one or more of the conductive lines. In some cases, the MRAM device may additionally or alternatively include circuitry which is configured to terminate an application of current along one or more of the conductive lines before magnetization states of one or more magnetic elements selected for a write operation of the device are changed. In either case, a device is provided which includes an MRAM array and a first storage circuit comprising one or more magnetic elements, wherein the first storage circuit is configured to store parameter settings characterizing operations of the magnetic random access memory array within the magnetic elements. Methods for operating the devices provided herein are contemplated as well.

23 Claims, 12 Drawing Sheets

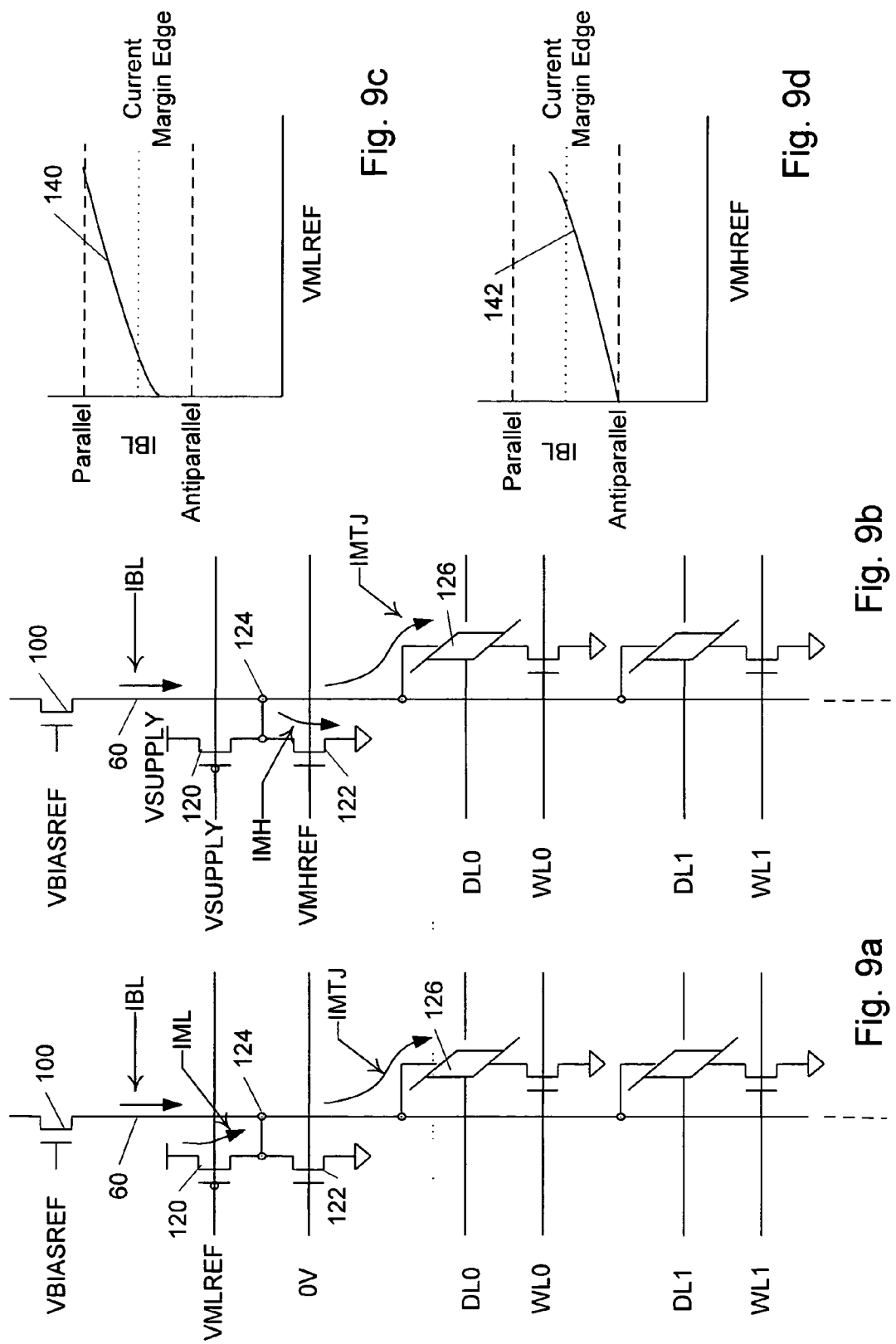

MAGNETIC MEMORY ARRAY ARCHITECTURE

BACKGROUND OF THE INVENTION

1. Field of the Invention

This invention relates to magnetic random access memory devices and, more particularly, to magnetic random access memory architectures.

2. Description of the Related Art

The following descriptions and examples are given as background information only.

Recently, advancements in the use of magnetoresistive materials have progressed the development of magnetic random access memory (SAM) devices to function as viable non-volatile memory circuits. In general, MRAM circuits exploit the electromagnetic properties of magnetoresistive materials to set and maintain information stored within individual magnetic memory cell junctions or elements of the circuit. In particular, MRAM circuits utilize magnetization direction to store information within a magnetic junction, and differential resistance measurements to read information from the magnetic junction. In general, an MRAM circuit includes one or more conductive lines with which to generate magnetic fields such that the magnetization directions of one or more magnetic junctions of the MRAM circuit may be set. Typically, the conductive lines are arranged in series of columns and rows having magnetic junctions interposed at the overlap points of the conductive lines. In this manner, the circuit may include a plurality of memory cells arranged within an array. In some cases, the conductive lines may be referred to as "bit" and "digit" lines. In general, "bit" lines may refer to conductive lines that are used for both read and write operations of the magnetic junction. In most cases, the bit lines are arranged in contact with the magnetic junctions. "Digit" lines, on the other hand, may refer to the conductive lines spaced vertically adjacent to the magnetic junctions and used primarily during write operations of the array.

In general, an individual magnetic junction can be written to by applying current simultaneously along a bit line and a digit line corresponding to the particular magnetic junction. Such an individual magnetic junction may herein be referred to as a selected magnetic junction, or the magnetic junction intentionally targeted for a writing procedure. During the writing procedure, however, the multitude of other magnetic junctions arranged vertically adjacent to the bit line and the digit line corresponding to the selected junction will also sense current. Such magnetic junctions are herein referred to as half-selected junctions or disturbed junctions, since a magnetic field is induced about them from the bit or digit line used to program the selected magnetic junction. Even though a less effective magnetic field is applied to these disturbed cells, variations within magnetic junctions may allow a magnetic field induced by one current carrying line to switch the magnetization directions of one or more of the disturbed cells. In addition, variations within magnetic cell junctions may cause switching of magnetization directions to vary relative to pulse width and timing of current applications along the bit and digit lines. As a result, a false bit may, in some embodiments, be inadvertently written to one or more of the disturbed cells during a write operation of the array, reducing the reliability of the device.

Due to the random incidence and magnitude of magnetic cell junction variations, the distribution of current needed to program a selected cell without programming disturbed cells may vary from cell to cell as well as die to die and wafer to wafer. As a result, determining a program switching distribution for an array may, in some embodiments, be difficult. In some embodiments, the temperature of magnetic cell junctions and/or the direction along which current is applied to a bit line may affect the amplitude, pulse width and/or timing needed to induce a change in magnetization states within magnetic cell junctions, making the determination of a program switching distribution more complicated. In some cases, process parameters and design specifications of device may be specifically configured to accommodate a program switching distribution arbitrarily set for the device. In this manner, reliability of the device may not depend on determining a program switching distribution. However, accommodating a specific program switching distribution typically results in process parameters and design specifications having tight tolerances, which may not be easily obtained in some embodiments. As a result, production yield may be undesirably low and manufacturing costs may be unreasonably high.

During a read operation of an MRAM array, data may be read from a magnetic cell junction by creating a current path from a corresponding bit line through the magnetic cell junction to an underlying transistor such that a resistance measurement may be obtained. The underlying transistor may be turned "on" by the application of a bias voltage. In general, the resistance measured through a magnetic cell junction may be a function of the applied bias voltage. Variations within magnetic cell junctions may, however, cause the level of bias voltage attributed to a maximum sense signal to vary from cell to cell as well as from die to die and wafer to wafer. Consequently, the determination of an optimum bias voltage may be difficult in some embodiments. In addition, variations within magnetic cell junctions may cause a breakdown voltage of a magnetic cell junction to be low in some embodiments. Low breakdown voltages may, in some cases, cause read failures, reducing the reliability of the device. In general, a breakdown voltage of a magnetic cell junction may decrease with time. As such, an MRAM array may function properly during testing, but may, in some cases, fail at a later point in time, resulting in unpredictable reliability.

During a read operation of an MRAM array, data may be read from a magnetic cell junction by creating a current path from a corresponding bit line through the magnetic cell junction to an underlying transistor such that a resistance measurement may be obtained. The underlying transistor may be turned "on" by the application of a bias voltage. In general, the resistance measured through a magnetic cell junction may be a function of the applied bias voltage. Variations within magnetic cell junction may, however, cause the level of bias voltage attributed to a maximum sense signal to vary from cell to cell as well as from die to die and wafer to wafer. Consequently, the determination of an optimum bias voltage may be difficult in some embodiments. In addition, variations within magnetic cell junctions may cause a breakdown voltage of a magnetic cell junction to be low in some embodiments. Low breakdown voltages may, in some cases, cause read failures, reducing the reliability of the device. In general, a breakdown voltage of a magnetic cell junction may decrease with time. As such, an MRAM array may function properly during testing, but may, in some cases, fail at a later point in time, resulting in unpredictable reliability.

In order to examine the functionality an MRAM array, various settings of the functional parameters of the array may be tested. In some embodiments, a complementary metal-oxide-semiconductor (CMOS) memory circuit may be configured to provide a variety of settings to an MRAM array. However, since a CMOS memory circuit is volatile, the circuit cannot be used to provide settings for an MRAM array without an available source of settings to load therein. In some cases, the settings may be provided to an MRAM array by fuses and/or metal mask options. Settings within fuses and metal mask options, however, are fixed and, therefore, are generally difficult to provide a variety of settings to an array for testing. For example, fuses can only be blown once and, therefore, cannot be reprogrammed. A vast number of fuses may be coupled to an array to provide a variety of settings, but such an incorporation of fuses may undesirably occupy a large area on the chip and add additional manufacturing steps. In addition, metal mask options cannot be adjusted on a die by die basis.

As noted above, several factors may affect operations of an MRAM array and, in some embodiments, cause read and/or write failures. Failures which are not attributed to such factors, however, may occur within an MRAM array as well. For example, write failures may occur if an inadequate amount of current is supplied to the bit and digit lines. In particular, data may not be correctly programmed within an array if a sufficient amount of current is not applied to the bit and digit lines. Such write failures may occur during power supply failures, reducing the reliability of the device.

Therefore, it would be advantageous to develop an MRAM device which does not allow a write operation to be performed during a power supply failure. In addition, it may be beneficial to provide an MRAM device which is able to change and optimize parameter settings at which the device is operated. Moreover, it would be advantageous to provide methods for identifying magnetic cell junctions which may be susceptible to write and/or read failures. Furthermore, it may be beneficial to develop a magnetic memory array with a means to provide a non-volatile source of functional settings as well as the ability to reprogram such a means.

SUMMARY OF THE INVENTION

The problems outlined above may be in large part addressed by a magnetic random access memory device which includes circuitry configured to vary current applications along one or more of the conductive lines which are used to set magnetization states of an array of magnetic elements. In some cases, the circuitry may be configured to vary the point in time and/or length of time the current is applied to the one or more conductive lines. In addition or alternatively, the circuitry may be configured to vary the amount of current applied to the one or more conductive lines. In some embodiments, the circuitry may be configured to vary the amount of current with respect to the configuration of the conductive lines. For example, the circuitry may be configured to vary the amount of current with respect to the direction along which the current is applied. In addition or alternatively, the circuitry may be configured to vary the amount of current with respect to the temperature of the magnetic random access memory device.

In some embodiments, the circuitry may be configured to vary current applications for read operations of the magnetic random access memory device. In additionally or alternatively, the circuitry may be configured to vary current applications for write operations of the magnetic random access memory device. For example, the circuitry may, in some embodiments, be configured to apply a write pulse current along one or more of the conductive lines for a length of time sufficient to allow a source current to be measured from a voltage power supply coupled to the magnetic random access memory device during the application of the write pulse current. In addition or alternatively, the circuitry may, in some embodiments, be configured to terminate an application of a write pulse current along one or more of the conductive lines before magnetization states of one or more magnetic elements selected for a write operation of the device are changed. More specifically, the circuitry may be configured to monitor a voltage level of a power supply coupled to the magnetic random access memory device and terminate the application of current upon determining the voltage level is below a predetermined threshold.

In some embodiments, the magnetic random access memory device may include a reprogrammable non-volatile latch configured to store parameter settings for the current applications. In particular, the magnetic random access memory device may include a first storage circuit comprising one or more magnetic elements in which to store parameter settings characterizing operations of the memory array. In some cases, the parameter settings may be settings selected for use by a customer of the device. In other embodiments, the parameter settings may be settings selected for testing qualitative features of the magnetic random access memory array. In either case, the magnetic random access memory device may, in some embodiments, include an alternative means by which to store parameter settings characterizing operations of the magnetic random access memory array. Such an alternative means may be in addition to or alternative to the first storage circuit. In cases in which the device includes both the first storage circuit and the alternative means, the magnetic random access memory device may include a second storage circuit configured to send a control signal by which to select the first storage circuit or the alternative means to send the parameter settings to the magnetic random access memory array. Such a second storage circuit may, in some embodiments, include one or more magnetic elements.

A method for determining write pulse amplitude for a magnetic element is provided herein. The method may include coupling a power source to a magnetic random access memory device, writing to at least one magnetic memory cell junction within the magnetic random access memory device and monitoring current levels supplied from the power source. The determination of the write pulse amplitude for the magnetic junction may be based on a difference between a current level measured during the step of writing and a current level measured not during the step of writing. In some embodiments, the difference may be between the current level measured during the step of writing and a current level measured prior to the step of writing. In other embodiments, the difference may be between the current level measured during the step of writing and a current level measured subsequent to the step of writing. In either case, the step of writing may include raising voltage on an address path of the magnetic random access memory device to a level higher than a voltage of the power supply. In addition, the step of writing may include applying a current along a bit line coupled to the magnetic element for more than approximately 10 ns and, in some embodiments, more than approximately 100 ns.

A method for identifying magnetic elements with a narrow read sensing signal window is contemplated herein. The method may include applying an initial bias voltage through a magnetic element of a memory cell array, altering the bias voltage incrementally and monitoring current levels associated with the initial bias voltage and the incremental bias voltages. In some embodiments, altering the bias voltage incrementally may include increasing the bias voltage. In other cases, altering the bias voltage incrementally may include decreasing the bias voltage. In either embodiment, the method may further include determining a difference in current levels between the initial bias voltage and an incremental bias voltage associated with a level of current corresponding to a midpoint between two logic states of the magnetic element. Upon determining the difference is less than a predetermined threshold, the magnetic element may be classified as having a relatively narrow read sensing signal window. In some cases, the detection of such a narrow read sensing signal window may lead to the determination that the magnetic element is unsatisfactory for commercial use.

There may be several advantages for providing the magnetic random access memory device and methods described herein. In particular, the methods and magnetic random access memory device present a means by which to automatically alter the operational settings of the device. In some embodiments, the circuitry adapted to provide such a means may be configured to alter the operational settings with respect to temperature such that the device may reliably operate in different temperature environments. In other cases, the magnetic random access memory device and methods described herein may be used to determine optimum parameter settings by which to operate the device. More specifically, the magnetic random access memory device and methods may be used to determine write and read pulse amplitudes, timing, and lengths which result in a high reliability device. In addition, the magnetic random access memory device and methods provided herein may be used to identify weak magnetic elements which may reduce the reliability of the device. Such an identification may allow the magnetic random access memory device to be modified such that the weak junctions are not used during an operation of the device. Furthermore, a magnetic random access memory device having the circuitry described herein may be tested more quickly than a device which does not include such circuitry, increasing production throughput.

BRIEF DESCRIPTION OF THE DRAWINGS

Other objects and advantages of the invention will become apparent upon reading the following detailed description and upon reference to the accompanying drawings in which:

FIG. 9a depicts an exemplary employment of circuitry serving as an adjustable read margin mode circuit of the MRAM device illustrated in FIG. 1 in which current is added to current applied along a bit line of the MRAM device;

FIG. 9b depicts a different employment of the circuitry shown in FIG. 9a in which current is subtracted from the current applied along the bit line;

FIG. 9c depicts an exemplary graph of bit line current versus applications of voltages during the employment of the circuitry shown in FIG. 9b;

FIG. 9d depicts an exemplary graph of bit line current versus applications of voltages during the employment of the circuitry shown in FIG. 9a;

Figure 1:
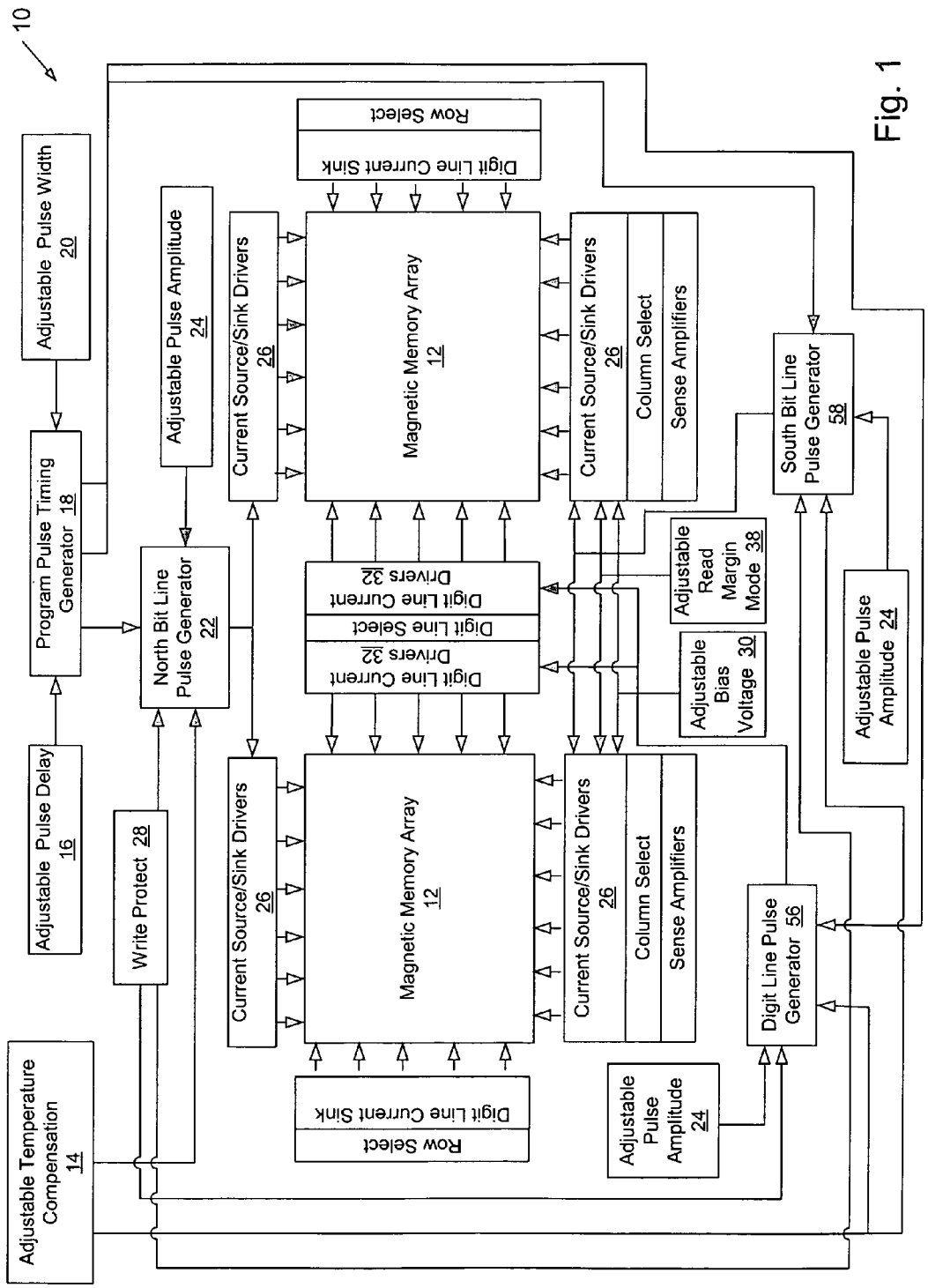
FIG. 1 depicts an exemplary architectural layout of a magnetic random access memory array (MRAM) device.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning to the drawings, an exemplary architectural layout of a magnetic random access memory (MRAM) device is illustrated in FIG. 1. In particular, MRAM device 10 is shown having a plurality of auxiliary components coupled to magnetic memory arrays 12. An "MRAM device", as used herein, may generally refer to any integrated circuit comprising a magnetic memory array. Although MRAM device 10 is shown to include two magnetic memory arrays, MRAM device 10 may include any number of magnetic memory arrays and, therefore, is not necessarily restricted to the illustration shown in FIG. 1. A "magnetic memory array", as used herein, may generally refer to any memory circuit comprising an array of magnetic elements configured to store bits. For example, magnetic memory arrays 12 may include arrays of magnetic tunnel junctions or arrays of giant magnetoresistance junctions. In either case, magnetic memory arrays 12 may also include a plurality of other components, such as electrodes, contacts, vias and transistors. As used herein, the terms "magnetic elements" and "magnetic cell junctions" may generally refer to patterned layers of magnetic layers used within magnetic memory arrays to store bits in one of two logic states and, therefore, may be used interchangeably herein.

In addition, magnetic memory arrays 12 may include conductive lines which are configured to set magnetization states of the magnetic elements. The conductive lines may serve as bit and/or digit lines, depending on the configuration of magnetic memory arrays 12. In particular, magnetic memory arrays 12 may, in some embodiments, include both bit and digit lines with which to set magnetization states of the magnetic elements arranged therein. In other embodiments, however, magnetic memory arrays 12 may not employ digit lines for write operations of the arrays. More specifically, magnetic memory arrays 12 may be configured to set magnetization states without current applications along digit lines and, therefore, may not include digit lines in some cases. As will be described in more detail below, some of the auxiliary components coupled to magnetic memory arrays 12 may be configured to vary current applications along one or more of the conductive lines configured to set magnetization states of the magnetic elements within the arrays. More specifically, MRAM device 10 may include circuitry configured to vary current applications along one or more bit and/or digit lines of magnetic memory arrays 12.

In general, MRAM device 10 may include any number of the auxiliary components or circuitry described herein. In particular, MRAM device 10 may include one of the components, less than all of the components, or all of the components described herein. FIGS. 2, 3, 5, 7, 8 and 10 illustrate exemplary circuits that may constitute some of the auxiliary components coupled to magnetic memory arrays 12. FIGS. 4, 6, 9 and 11 illustrate exemplary diagrams and flowcharts used to describe operations of some of the auxiliary components within MRAM device 10. Consequently, FIGS. 2-11 are discussed interchangeably with FIG. 1 to describe the circuits and functions of MRAM device 10. In addition, the exemplary schematic control diagram for MRAM device 10 depicted in FIG. 12 and the exemplary configuration of a non-volatile control data latch used to store operational settings of MRAM 10 depicted in FIG. 13 are discussed interchangeably with the components of FIG. 1.

As shown in FIG. 1, MRAM device 10 may include program pulse timing generator 18. In general, program pulse timing generator 18 may include a circuit configured to regulate the time at which write current pulses are applied to bit and/or digit lines of magnetic memory arrays 12. In embodiments in which both bit and digit lines are used for write operations of magnetic memory arrays 12, program pulse timing generator 18 may be configured, in some cases, to independently regulate the time and/or length at which current is applied to the bit and digit lines. In some embodiments, program pulse timing generator 18 may be configured to regulate the timing of current applications along the bit and digit lines to be substantially similar. In other embodiments, however, program pulse timing generator 18 may be configured to regulate the timing of current applications along the bit and digit lines to be different. In particular, program pulse timing generator 18 may be configured to generate different lengths of pulse write currents specific to the bit and digit lines of the array. In addition, program pulse timing generator 18 may be configured to generate different pulse write delays specific to the bit and digit lines of the array.

Figure 2:
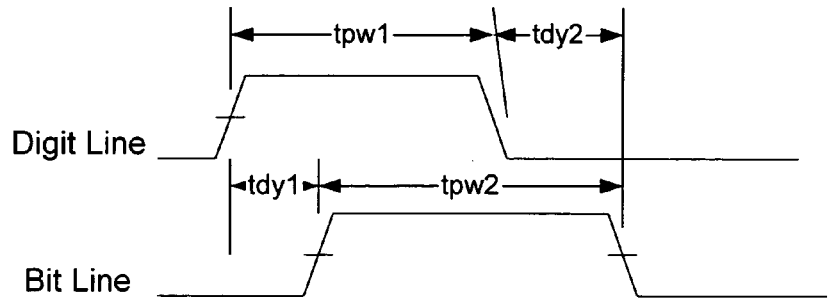
FIG. 2 depicts an exemplary timing chart relating program pulse delays and widths along bit and digit lines of the MRAM device depicted in FIG. 1.

In an effort to describe the roles of write current pulses and delays with respect to MRAM operations, an exemplary timing chart relating program pulse delays and widths along bit and digit lines of an MRAM device is illustrated in FIG. 2. In particular, FIG. 2 illustrates current pulse width tpw1 along a digit line and a current pulse width tpw2 along a bit line. In addition, the timing chart in FIG. 2 illustrates delay tdy1 denoting the postponement of an application of current along the bit line relative to the start of a current application along the digit line. Moreover, the timing chart illustrates delay tdy2 denoting the extension of applied current along the bit line relative to the termination of the current application along the digit line.

In general, a delay of current along a bit line (e.g., tdy1) may allow a magnetic field generated from an application of current along a digit line to position magnetic vectors within magnetic elements of a memory array into a state more susceptible to switching. In such a state, the magnetic vectors may be more susceptible to reversing their overall direction at a lower magnetic field when current is applied to the bit line than when the magnetic vectors are not positioned in such a state. Consequently, the subsequent application of current along the bit line may be lower than in embodiments in which the current application along the bit line is not delayed. The delay of the termination of current along the bit line relative to the termination of current along the digit line (i.e., tdy2) may insure that the magnetic vectors within the magnetic elements are arranged in a stable state along the direction to which they have been switched. In this manner, delay tdy2 may allow the magnetic vectors to be less prone to switch back to the original direction they were oriented toward before the application of current along the bit line.

In some embodiments, program pulse timing generator 18 may be configured to generate tpw1 and tpw2 and pulse delays tdy1 and tdy2 to be between approximately 1 ns and approximately 500 ns. In some embodiments, it may be advantageous to configure program pulse timing generator 18 to generate pulse widths tpw1 and tpw2 to be between approximately 1 ns and approximately 50 ns or, more specifically, between approximately 1 ns and approximately 20 ns. In addition, it may be advantageous to configure program pulse timing generator 18 to generate pulse delays tdy1 and tdy2 to be between approximately 1 ns and approximately 10 ns or, more specifically, between approximately 1 ns and approximately 5 ns. Such pulse width and delay ranges may be particularly suitable for memory operations used by a consumer of the device. In other cases, however, it may be appropriate to generate longer or shorter pulse widths and/or pulse delays. For example, in some testing modes, it may be advantageous to extend a pulse width along a bit line for more than approximately 50 ns. An exemplary embodiment of a test mode including such a bit line pulse width is described in more detail below in reference to FIG. 5.

As noted above, program pulse timing generator 18 may be configured to generate different pulse widths and/or delays for the bit and digit lines. In other embodiments, however, program pulse timing generator 18 may be configured to generate pulse widths and/or delays of the same magnitude for both the bit and digit lines. In addition, although delays tdy1 and tdy2 are shown in FIG. 2 as being shorter than pulse widths tpw1 and tpw2, delays tdy1 and/or tdy2 may be configured to have the same or a shorter duration than pulse widths tpw1 and/or tpw2. In general, current pulse widths and delays along bit and digit lines are preferably set to switch the overall direction of the magnetic vectors within the magnetic elements as well as minimize the write time for the magnetic memory array. Variations within magnetic elements, however, may cause optimum pulse width and timing setpoints of current applications to vary between devices. Incorporating adjustable pulse delay and/or adjustable pulse width circuits within a device, however, may offer a manner in which to set the timing of the current pulse widths and delays of current applications along bit and digit lines to be specific to magnetic memory arrays of the device. Consequently, MRAM device 10 may, in some embodiments, include adjustable pulse delay 16 and adjustable pulse width 20 coupled to program pulse timing generator 18 such that pulse widths and delays associated with current applications along the bit and/or digit lines may be altered.

Figure 3:
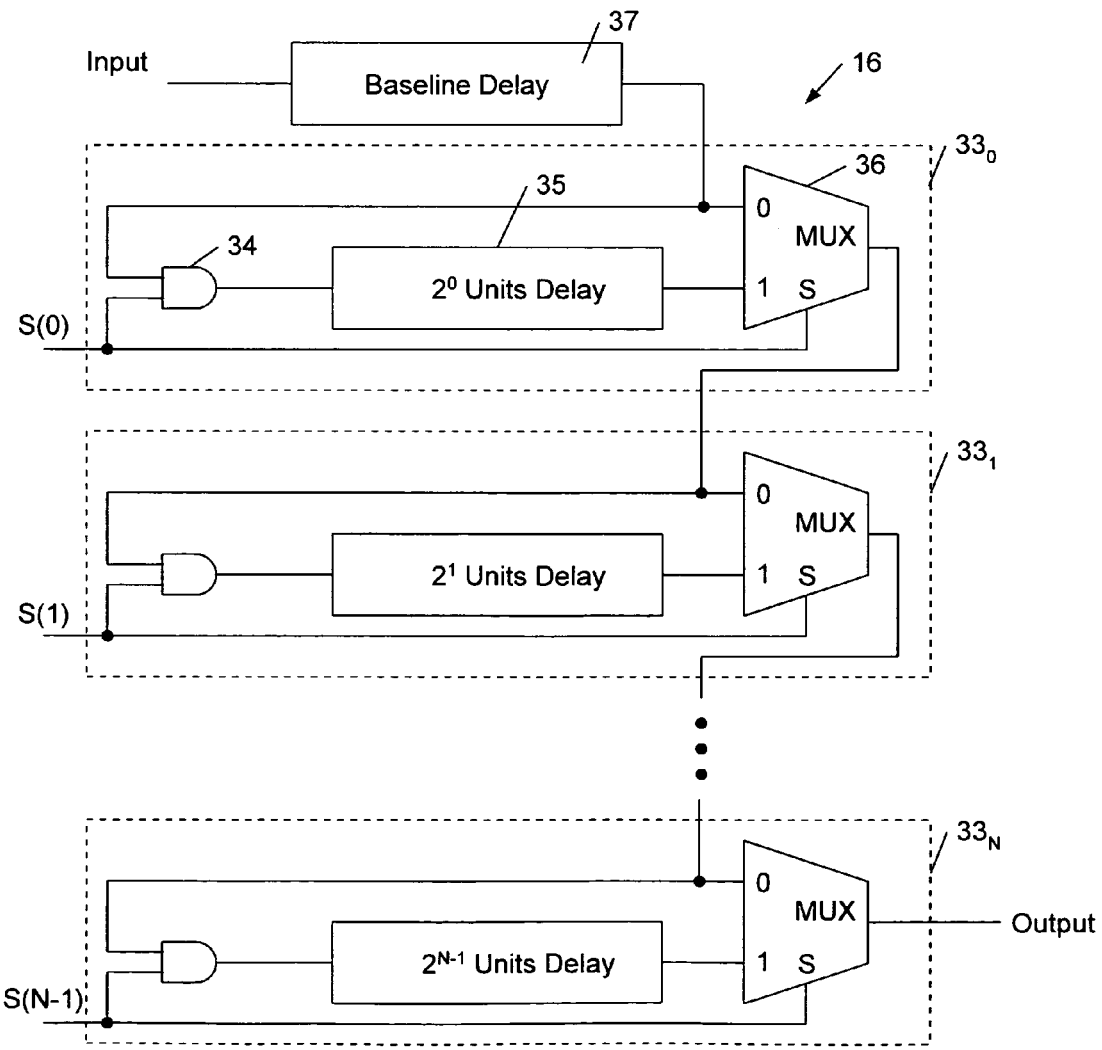
FIG. 3 depicts exemplary circuitry for an adjustable pulse delay circuit included within the MRAM device of FIG. 1.
Figure 4:
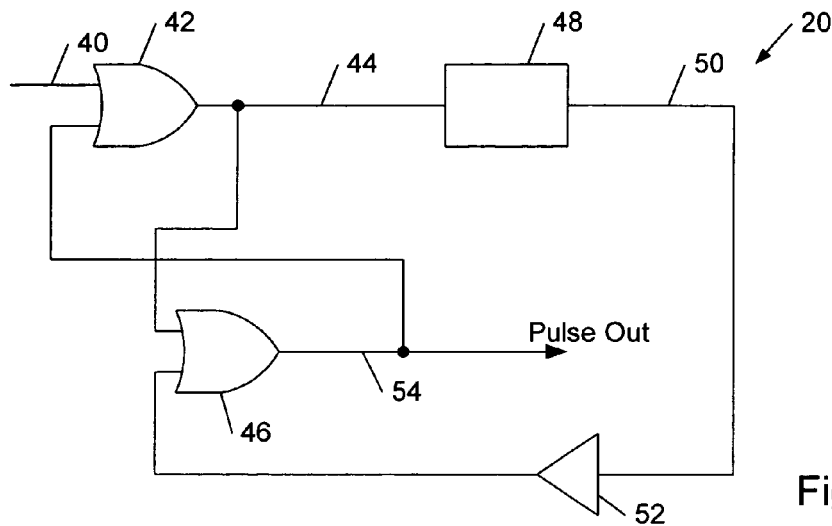
FIG. 4 depicts exemplary circuitry for an adjustable pulse width circuit included within the MRAM device of FIG. 1.

In general, the timing of the current pulse widths and delays of current applications along bit and digit lines may be set during a test mode of a device. In this manner, the reliability and speed of magnetic memory arrays 12 may be optimized for consumer use. Adjustable pulse delay 16 may include a circuit configured to alter the point in time at which current is applied and/or released from bit and/or digit lines of magnetic memory arrays 12. In addition, adjustable pulse width 20 may include a circuit configured to alter the length of the current applications to the bit and/or digit lines of magnetic memory arrays 12. Exemplary circuits of adjustable pulse delay 16 and adjustable pulse width 20 are illustrated in FIGS. 3 and 4, respectively. Other configurations of circuits, however, may be used for adjustable pulse delay 16 and adjustable pulse width 20, depending on the design specifications of the device. In other embodiments, adjustable pulse delay 16 and/or adjustable pulse width 20 may be omitted from MRAM device 10. In particular, the inclusion of adjustable pulse delay 16 and/or adjustable pulse width 20 is not necessarily needed for the operation of MRAM 10.

As shown in FIG. 3, adjustable pulse delay 16 may, in some embodiments, include plurality of delay cells $33_0$-$33_n$. Each delay cell may include gate 34, delay block 35 and multiplexor 36 as depicted in delay cell 330. In addition, adjustable pulse delay 16 may include baseline delay 37. As shown in FIG. 3, adjustable pulse delay 16 may be configured to send signals from baseline delay 37 to multiplexor 36 of delay cell 330. In addition, adjustable pulse delay 16 may be configured to send an output signal from a multiplexor of one delay to the multiplexor of the succeeding delay. In this manner, the delay of a signal transmitted through the circuit may be determined by summing the delays through which the signal traverses. In general, delay block 35 may include any number of delay units within each of delay cells $33_0$-$33_n$. In some embodiments, the number of delay units within each delay block may correspond to the position of its corresponding delay cell within plurality of delay cells $33_0$-$33_n$, as shown in FIG. 3. In particular, the delay blocks within delay cells $33_0$-$33_n$ may, in some embodiments, include $2^n$ units. In other embodiments, the number of delay units within each delay block may not correspond to the position of the corresponding delay cells within delay cells $33_0$-$33_n$.

As shown in FIG. 3, the transmission of a signal through delay cells $33_0$-$33_n$ may or may not traverse through delay block 35 within each delay cell. In particular, each of delay cells $33_0$-$33n$ may be configured to receive selection signal S(n-1) with which to select whether the signal transferred through delay cells $33_0$-$33_n$ is transmitted through delay block 35 of each delay cell. In this manner, adjustable delay circuit 16 may be configured to offer a means to vary the delay of a signal transmitted therethrough to produce a target delay. Gate 34 may be used to prevent glitches that may occur when a selection bit changes states on a particular transition. In any case, adjustable pulse delay 16 may offer a manner in which to delay the application of current along a bit line and/or digit line as well as a delay in which to terminate an application of current along a bit line and/or digit line. In general, baseline delay 37 and the delay units within delay block 35 may offer any amount of delay and, in some embodiments, each offer a delay between approximately 0 ns and approximately 100 ns. As noted above, other configurations of circuits may be used for adjustable pulse delay 16, depending on the design specifications of the device. Consequently, adjustable pulse delay 16 is not necessarily restricted to the embodiment illustrated and described in reference to FIG. 3.

Turning to FIG. 4, an exemplary circuit for adjustable pulse width 20 is illustrated. In particular, FIG. 4 illustrates adjustable pulse width 20 including input line 40 configured to receive a signal and send the signal to a logic NOR gate 42. NOR gate 42 produces an output signal on line 44 which is coupled to a second NOR gate 46 and a delay block 48. NOR gates 42 and 46 are cross-coupled such that the output of each NOR gate is coupled to an input of the other NOR gate. Delay block 48 delays the output signal received from NOR gate 42 and generates a delayed signal along line 50, which is coupled to NOR gate 46. In some embodiments, adjustable pulse width 20 may include inverter 52 arranged along line 50. Alternatively, an inverter may be located within delay block 48 such that the output of delay block 48 is coupled directly to NOR gate 46. In either case, delay block 48 may include any number of delay units to provide a specific propagation delay through the device. As a result, NOR gate 46 generates an output signal PULSE OUT on line 54 for use by MRAM device 10. As noted above, other configurations of circuits may be used for adjustable pulse width 20, depending on the design specifications of the device. For example, different logic devices may be utilized within a circuit for adjustable pulse width 20. In any case, adjustable pulse width 20 is not necessarily restricted to the embodiment illustrated and described in reference to FIG. 4.

Figure 5:
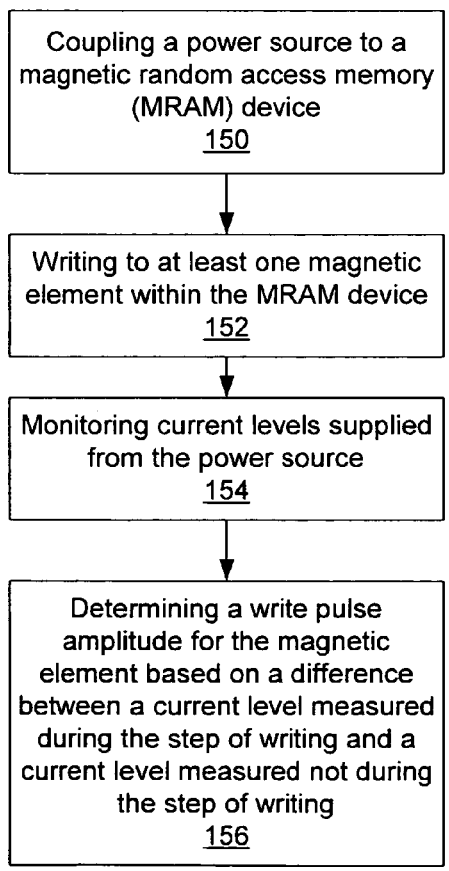
FIG. 5 depicts a flowchart of an exemplary method for determining a write pulse amplitude for the MRAM device of FIG. 1.

As noted above, it may be advantageous to apply a current pulse width greater than approximately 50 ns along a bit line for some test write operations. In particular, a test mode which employs an extended write operation may be used to determine a write pulse amplitude for a device in some embodiments. A flow chart of an exemplary test operation used to determine a write pulse amplitude for a MRAM device is illustrated in FIG. 5. In particular, FIG. 5 depicts a method including block 150 in which a power source is coupled to an MRAM device. In addition, the method includes writing to least one magnetic element within the MRAM device as noted in block 152. In some cases, block 152 may include raising a voltage application along an address path of the MRAM device to a level higher than a voltage of the power supply. Raising a voltage to such a level may route the signal along the address path to adjustable pulse width 20 instead of memory storage latches used to generate a set write pulse current as described in more detail below in reference to FIG. 12.

In this manner, the current applied along a bit line coupled to the selected magnetic element during the write operation may be altered to have a sufficiently long pulse width. For example, in some embodiments, the current may be applied to the bit line for more than approximately 50 ns. In some cases, the current applied along the bit line may be longer than approximately 100 ns or, more specifically, longer than approximately 200 ns. In any case, an extended pulse width may advantageously allow the amount of current drawn from the power source during the write operation to be measured. During conventional write operations (including test and production operations, such as those employed by a customer of the device) of an MRAM device, a write pulse width may be less than approximately 20 ns and, in some embodiments, less than approximately 5 ns. Such a relatively short write pulse width may not offer an adequate amount of time with which to measure the current level drawn from the power source of the device and, therefore, does not offer a manner in which the write pulse amplitude of the write operation to be determined using the method outlined in FIG. 5.

As shown in FIG. 5, the method may include block 154 which includes monitoring current levels supplied from the power source. In addition, the method may include block 156 which determines a write pulse amplitude for the magnetic element based on a difference between a current level measured during the step of writing to the magnetic element and a current level measured not during the step of writing. In some embodiments, block 156 may include determining a difference between the current level measured during the step of writing and a current level measured prior to the step of writing. In other embodiments, block 156 may include determining a difference between the current level measured during the step of writing and a current level measured subsequent to the step of writing.

Returning to FIG. 1, program pulse timing generator 18 may be coupled to north bit line pulse generator 22, south bit line pulse generator 58 and digit line pulse generator 56. Such pulse generators may include circuitry by which to generate current applications along the bit lines and digit lines of magnetic memory arrays 12 and, therefore, are coupled to current source/sink drivers 26 and digit line current drivers 32 as shown in FIG. 1. In particular, digit line pulse generator 56 may include circuitry by which to generate current along digit lines of magnetic memory arrays 12. For example, digit line pulse generator 56 may include a reference voltage source and a P-MOS transistor coupled to one end of the digit line and while the other end of the digit line is coupled to ground. Other configurations of circuits, however, may be used for digit line pulse generator 56, depending on the design specifications of the device.

Figure 6:
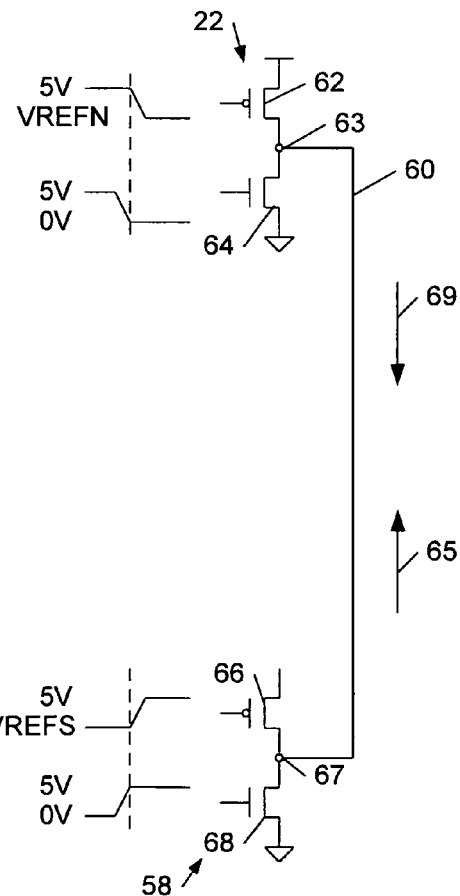
FIG. 6 depicts exemplary circuitry for bit line pulse generator circuits included within the MRAM device of FIG. 1.

As used herein, the reference of a north bit line and a south bit line for pulse generators 22 and 58 may refer to the opposing ends of a bit line to which current may be applied such that current applications through the bit line are bidirectional. As such, north bit line pulse generator 22 may include circuitry by which to generate current along one direction of a bit line and south bit line pulse generator 58 may include circuitry by which to generate current along the other direction of the bit line. Exemplary circuits that may used for north bit line pulse generator 22 and south bit line pulse generator 58 are illustrated in FIG. 6. Other configurations of circuits, however, may be used for the bit line generators, depending on the design specifications of the device. As such, north bit line pulse generator 22 and south bit line pulse generator 58 are not necessarily restricted to the circuitry illustrated and described in reference to FIG. 6.

FIG. 6 illustrates a circuit for north bit line pulse generator 22 coupled between voltage reference VREFN and bit line 60. In addition, FIG. 6 illustrates a circuit for south bit line pulse generator 58 coupled between voltage reference VREFS and bit line 60. Such circuits may be configured such that when voltage reference VREFN goes low and voltage reference VREFS goes high, current flows from node 63 of north bit line pulse generator 22 to node 67 of south bit line pulse generator 58. More specifically, P-MOS transistor 62 and N-MOS transistor 68 may be turned on to allow current to flow from node 63 to ground, as indicated by arrow 69. In addition, the circuits may be configured such that when voltage reference VREFN goes high and voltage reference VREFS goes low, current flows from node 67 to node 63. More specifically, P-MOS transistor 66 and N-MOS transistor 64 may be turned on to allow current to flow from node 67 to ground, as indicated by arrow 65. In this manner, the circuitry depicted in FIG. 6 may be used to apply current along both directions of bit line 60. As noted above, other circuitry may be used to apply current along both directions of bit line 60, depending on the design specifications of the device.

For write operations of MRAM devices, the current applications along the bit and digit lines are preferably sufficient to switch a selected magnetic element without switching the disturbed magnetic elements aligned with the bit and digit lines. Consequently, a range or "window" of current amplitudes may exist in which yield is maximized for the device. As noted above, however, the range of current needed to program a selected cell without programming disturbed cells may vary from die to die and wafer to wafer. As such, in some embodiments, it may be advantageous to incorporate circuitry within an MRAM device to alter the applications of current along the bit and/or digit lines such that an optimum window of current amplitudes may be determined specifically for the MRAM device. For instance, an exemplary process of altering applications of current along a bit and/or a digit line of an MRAM device may include altering a program current by increments of approximately 0.25 mA over a range between approximately 5 mA and approximately 15 mA. During such a process, the number of selected and disturbed cells that have their magnetization change at the incremental current changes may be tracked to create a probability switching distribution for the magnetic elements within the device. From such a probability switching distribution, an optimum current amplitude may be determined.

In some cases, the same probability switching distribution may be determined for north bit line pulse generator 22 and south bit line pulse generator 58. In such an embodiment, the amplitude of bit line write current set for consumer use of MRAM device 10 may be the same for both directions of the bit line. In other embodiments, however, it may be advantageous to set different write current amplitudes for north bit line pulse generator 22 and south bit line pulse generator 58. In particular, an interlayer coupling field between magnetic layers of a magnetic element may cause the amount of current needed to switch the magnetization of a magnetic element to be different with respect to the direction current is applied along a bit line. In general, an interlayer coupling field, as used herein, may refer to an imbalance of magnetic fields between two magnetic layers. As such, an interlayer coupling field may be a measure of the relative strengths of magnetic fields generated by two layers and their affect on each other. In some cases, variations within magnetic elements and/or process variables used to fabricate magnetic elements may cause interlayer coupling fields between magnetic layers to differ from die to die and wafer to wafer. Consequently, it may be advantageous to incorporate circuitry within an MRAM device which may be used to determine separate ranges of current amplitudes for both directions of a bit line, specific to the MRAM device.

In some cases, the circuitry used to alter current applications along the bit and/or digit lines of MRAM device 10 may be used to identify "errant" magnetic elements. In particular, during the course of altering current along the bit and/or digit lines of the device, errant magnetic elements, such as selected cells which require too large of a current to switch their magnetization or disturbed cells which change their magnetization at a low current level, may be detected. Such errant magnetic elements may be discarded and, in some embodiments, replaced, improving the reliability of the device. In general, the circuitry used to alter current applications of current to magnetic memory arrays 12 to identify errant elements, create a probability switching distribution and/or determine an optimum programming current may include any one or combination of circuitry included in adjustable pulse delay 16, adjustable pulse width 20, program pulse timing generator 18, north bit line pulse generator 22, south bit line pulse generator 58, digit line pulse generator 56 and/or adjustable pulse amplitudes 24, which are discussed in more detail below.

Figures 7A, 7B:
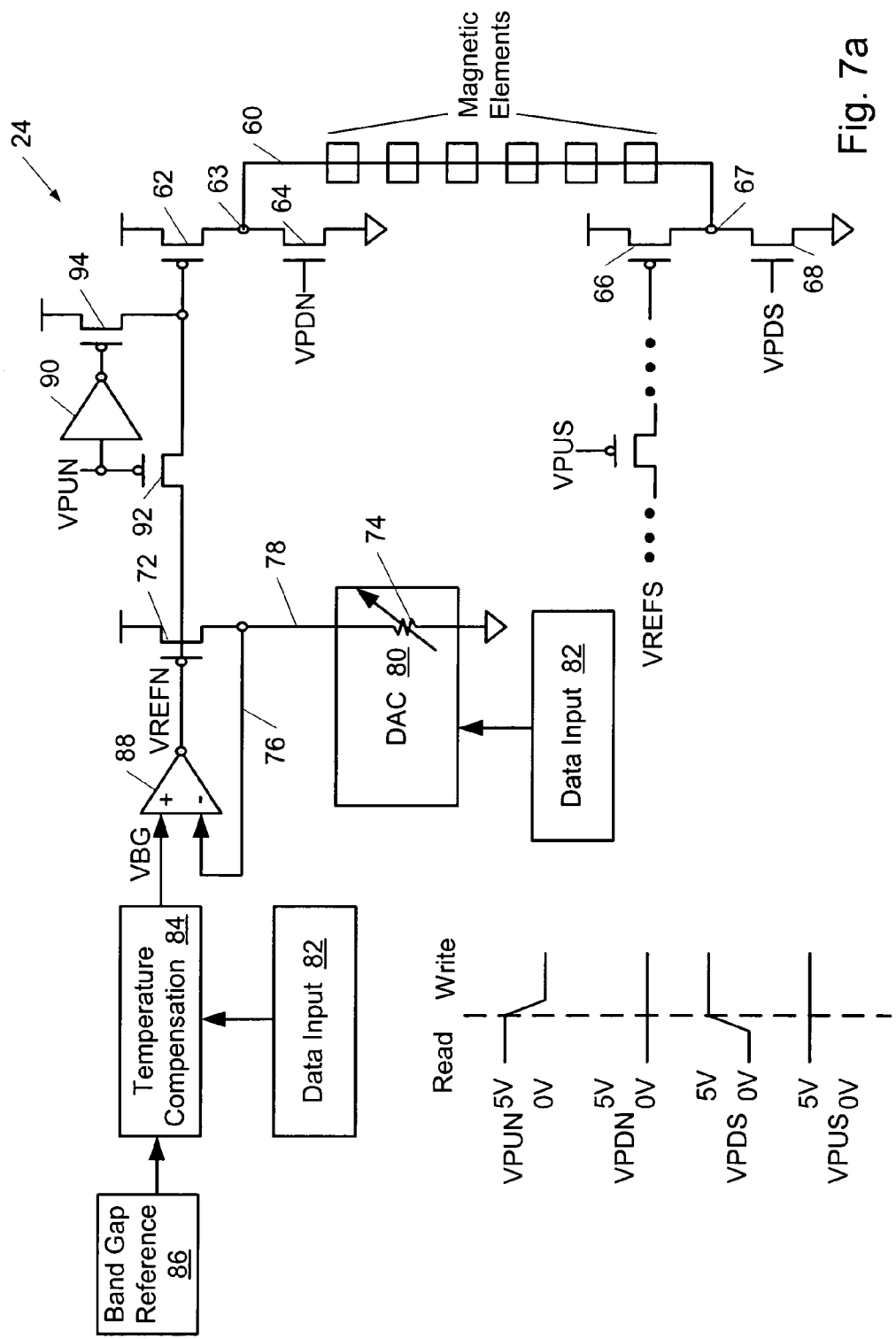
FIG. 7a depicts exemplary circuitry for an adjustable pulse amplitude circuit included within the MRAM device of FIG. 1.
FIG. 7b depicts a diagram illustrating exemplary applications of voltages for use with the circuitry shown in FIG. 7a during read and write operations of the MRAM device.

FIG. 1 illustrates MRAM device 10 including adjustable pulse amplitudes 24 coupled to north bit line pulse generator 22, south bit line pulse generator 58 and digit line pulse generator 56. In general, adjustable pulse amplitudes 24 may include any circuitry by which to alter the amplitude of current along the bit and digit lines of MRAM device 10. An exemplary set of circuitry for adjustable pulse amplitudes 24 coupled to north bit line pulse generator 22 and south bit line pulse generator 58 is illustrated in FIG. 7a. In particular, FIG. 7a illustrates exemplary circuitry which may be used to alter applications of current along bit line 60. As shown in FIG. 7a, adjustable pulse amplitude 24 may be controlled by applying voltage reference VREFN to the gate of transistor 72. When band gap voltage VBG goes high, current may be supplied through resistor 74. The voltage across resistor 74 is forced to precision voltage VBG on line 76 resulting in a precision current along line 78 that is adjustable by digital-to-analog converter (DAC) 80. The settings for DAC 80 may be controlled by data input 82, which may include laser fuses, metal mask options or data transmitted from a magnetic element storage latch arranged within MRAM device 10. An exemplary configuration of a magnetic element storage latch is illustrated in FIG. 13 and described in more detail below.

In some embodiments, it may be advantageous to adjust the amount of current applied to bit line 60 with respect to the temperature of MRAM device 10. In particular, the magnetization of magnetic elements may, in some cases, be switched more easily at higher temperatures relative to lower temperatures and, therefore, the current needed to switch the magnetization of a magnetic element may differ, depending on the environment the MRAM device is in. For example, a temperature coefficient relating switching fields and a temperature of an MRAM device may be approximately −11% per 100° C. Alternatively stated, the magnetic field needed to switch the magnetization of a magnetic element may gradually decrease by approximately 11% over a 100° C. temperature range. As such, it may be advantageous to include temperature compensation block 84 within adjustable pulse amplitude 24 in some cases. In general, temperature compensation block 84 may include any circuitry which may track the temperature of a device and alter a voltage reference with respect to such a temperature.

As shown in FIG. 7a, band gap reference 86 may be coupled to temperature compensation block 84. In general, band gap reference 86 may offer a reference voltage to temperature compensation block 84 relating to a known temperature. Temperature compensation block 84 may be controlled by data input 82, which may include laser fuses, metal mask options or data transmitted from a magnetic element storage latch arranged within MRAM device 10. As shown in FIG. 7a, the output of temperature compensation block 84 may be transmitted to operational amplifier (Op Amp) 88 to which the precision voltage along line 76 is also transmitted. In this manner, the current applied to bit line 60 may be compensated for temperature variations as well as altered by DAC 80. In other embodiments, temperature compensation block 84 or DAC 80 may be omitted from adjustable pulse amplitude 24. In particular, the inclusion of both temperature compensation block 84 and adjustable DAC 80 are not necessarily needed for the operation of adjustable pulse amplitude 24. In some embodiments, the circuitry used to compensate current amplitudes with respect to temperature may be distinct from adjustable pulse amplitudes 24. For example, in FIG. 1, adjustable temperature coefficient reference 14 is shown coupled to north bit line pulse generator 22, south bit line pulse generator 58 and digit line pulse generator 56 separate from adjustable pulse amplitudes 24.

In any case, the voltage generated from temperature compensation block 84 and/or adjustable DAC 80 may be transmitted to the gate of transistor 62 which is described above in reference to north bit line pulse generator 22. In particular, when voltage reference VPUN goes low, transistor 92 is turned on and transistor 94 is turned off through inverter 90. Since voltage reference VPDN is low, transistor 64 is off and, as a result, voltage reference VREFN may be transmitted to the gate of transistor 62. As noted above, voltage applied to the gate of transistor 62 as well as an application of reference voltage VPDS to transistor 68 may induce current flow along bit line 60 from node 63 to node 67. Since precision reference voltage VREFN is applied on the gate of transistor 62, the precision current through line 78 may be proportionally mirrored through bit line 60. More specifically, in cases in which transistor 66 is turned off and transistor 68 is turned on at the same time voltage reference VREFN is transmitted to the gate of transistor 62, current flow may be induced from node 63 to node 67. The induced current is related to the current through line 78 which is adjustable by DAC 80 as noted above.

A set of circuitry similar to the circuitry including transistors 72, 92 and 94, DAC 80 and temperature compensation 84 may be coupled to the south end of bit line 60 as indicated by the continuation dots arranged adjacent to transistor 66. Such circuitry may employ reference voltages VREFS, VPUS and VPDN for inducing current from node 67 to node 63. A diagram illustrating exemplary applications of voltages along reference voltages VPUN, VPDN, VPDS and VPUS is shown in FIG. 7b for read and write operations of MRAM device 10. A current flow from node 67 to node 63 may be enabled by bringing voltage reference VPUS low, transmitting reference voltage VREFS to the gate of transistor 66 at the same time voltage reference VPDN goes high turning on transistor 64.

In addition to replicating the circuitry described above for the south end of bit line 60, the circuitry may be additionally or alternatively replicated for adjustable current amplitude 24 coupled to digit line pulse generator 56. In some embodiments, adjustable pulse amplitudes 24 coupled to north bit line pulse generator 22, south bit line pulse generator 58 and/or digit line pulse generator 56 may include alternative circuitry by which to alter current provided thereto. As such, adjustable pulse amplitudes 24 are not necessarily restricted to the circuitry illustrated and described in reference to FIGS. 7a and 7b. In addition, one or more of adjustable pulse amplitudes 24 may be omitted from MRAM device 10 in some cases. In particular, the inclusion of adjustable pulse amplitudes 24 are not necessarily needed for the operation of MRAM device 10.

Returning to FIG. 1, MRAM device 10 may include adjustable bias voltage 30 coupled to current source/sink drivers 26. In some embodiments, adjustable bias voltage may be alternatively incorporated within the column select or sense amplifier circuitry coupled to magnetic memory arrays 12. In any case, adjustable bias voltage 30 may include any circuitry by which to adjust the amount of bias voltage applied to magnetic elements within magnetic memory arrays 12. In general, the resistance of a magnetic element is a function of the bias voltage applied across the tunnel junction. As such, the maximum sense signal from a magnetic element generally has an optimum bias voltage for a given circuit configuration. As with write current amplitudes, such an optimum bias voltage, however, may vary from die to die and wafer to wafer due to variations within magnetic elements and/or process variables used to fabricate the magnetic elements. Consequently, it may be advantageous, in some embodiments, to include circuitry within MRAM device 10 which allows a bias voltage applied through a magnetic element to be adjustable. For example, in some cases, using such circuitry may allow an optimum bias voltage to be determined for MRAM device 10.

In some cases, the adjustable bias voltage circuitry may additionally or alternatively be used to identify magnetic elements which may be susceptible to tunnel junction breakdowns. Generally, an optimum bias voltage for an MRAM device is well below the threshold voltage of the magnetic elements contained therein. However, variations within magnetic elements may cause a breakdown voltage of a tunneling layer within a magnetic element to be low in some embodiments. Low breakdown voltages may, in some cases, cause load failures, reducing the reliability of the device. In some cases, the threshold voltage of magnetic elements may be at a level at which data may be correctly read during some operations of the device, but may fail to read data correctly at other times. Such a scenario may be particularly undesirable in cases in which an MRAM device passes a test operation, but fails in production operations, such as those employed by a customer of the device. Consequently, the adjustable bias voltage circuitry described below in reference to FIG. 8 may, in some embodiments, be used to incrementally increase bias voltage levels applied to a magnetic element during test operations of MRAM device 10 such that the operation of the magnetic element relative to its breakdown voltage may be tested. As a result, magnetic elements within MRAM device 10 having low breakdown voltages may be detected and discarded or replaced, improving the reliability of the device.

Figure 8:
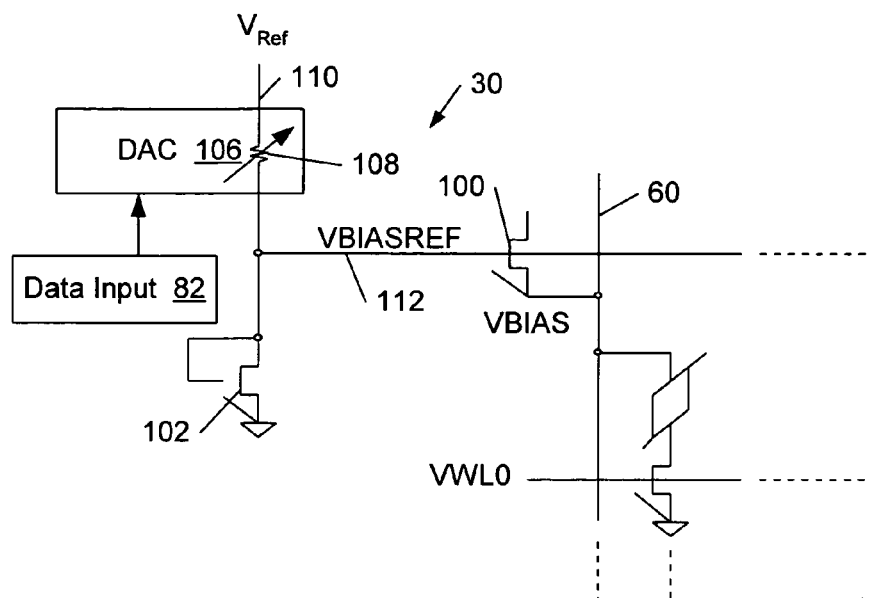
FIG. 8 depicts alternative circuitry for the adjustable pulse amplitude circuit included within the MRAM device of FIG. 1.

An exemplary configuration for adjustable bias voltage 30 is illustrated in FIG. 8. As shown in FIG. 8, adjustable bias voltage 30 may include transistors 100 and 102 and DAC 106 including resistor 108. Reference voltage $V_{ref}$ may be applied to line 110 passing through resistor 108 to generate bias reference voltage VBIASREF along line 112. The settings of DAC 106 may be used to alter the resistance of resistor 108 and, therefore, may be used to alter bias reference voltage VBIASREF. In general, the settings of DAC 106 may be controlled by data input 82, which may include laser fuses, metal mask options or data transmitted from a magnetic element storage latch arranged within MRAM device 10. Other circuitry other than the one depicted in FIG. 8 may be used to bias voltages applied to magnetic elements of MRAM device 10, depending on the design characteristics of the device. As such, the adjustable bias voltage circuit provided herein is not necessarily restricted to the circuitry illustrated and described in reference to FIG. 8. In other embodiments, the bias voltage circuit provided herein may be omitted from MRAM device 10. In particular, the inclusion of such circuitry is not necessarily needed for the operation of MRAM device 10.

Returning to FIG. 1, MRAM device 10 may further include adjustable read margin mode 38 coupled to current source/sink drivers 26. In general, adjustable read margin mode 38 may include any circuitry configured to add or subtract current from a bit line of MRAM device 10. An exemplary circuit adjustable read margin mode 38 is illustrated in FIGS. 9a and 9b. However, other circuitry may be used for adjustable read margin mode 38 as well or alternatively. As shown in FIGS. 9a and 9b, adjustable read margin mode 38 may include transistors 120 and 122 coupled to bit line 60 at node 124. Voltage reference VBIASREF applied to the gate of transistor 100 applies bias voltage VBIAS to bit line 60 with a value approximately equal to voltage reference VBIASREF minus the threshold voltage of transistor 100. Such a bias voltage along bit line 60 is applied across magnetic element 126, inducing current IMTJ through magnetic element 126. In such a case, current IBL is approximately equal to current IMTJ.

FIG. 9a illustrates the application of voltage reference VMLREF to the gate of transistor 120 such that current IML may reduce current IBL. Consequently, bit line current IBL appears as if magnetic element 126 has a higher resistance. By subtracting enough current, a magnetic element in a parallel state may appear to be moving towards an antiparallel state, eventually causing a failure. FIG. 9b illustrates adjustable read margin mode 38 in an alternative embodiment in which current is added to bit line 60. In particular, FIG. 9b illustrates the application of voltage reference VMHREF to the gate of transistor 122 such that current IMH may increase current IBL. In such an embodiment, bit line current IBL appears as if magnetic element 126 has a lower resistance. By adding enough current, a magnetic element in an antiparallel state may appear to be moving towards a parallel state, eventually causing a failure.

In some embodiments, adjustable read margin mode 38 may be used to determine a current margin window for determining the logic state of a magnetic element during a read operation of MRAM device 10. An explanation of such a process is described in reference to FIGS. 9c and 9d. FIGS. 9c and 9d illustrate exemplary graphs of current IBL versus applications of voltage references VMLREF and VMHREF, respectively. As shown in FIGS. 9c and 9d, the magnetization of magnetic element 126 may be in a parallel state at a high bit line current since there is low resistance within magnetic element 126 in such a state. Conversely, the magnetization of magnetic element 126 may be in an antiparallel state at a low bit line current, since there is a higher resistance within magnetic element 126 in such a state. The high and low bit line currents representing the parallel and antiparallel magnetic states, respectively, are highlighted by the upper and lower dashed lines in FIGS. 9c and 9d.

In general, a target bit line current level between the upper and lower dashed lines of FIGS. 9c and 9d may be designated as the edge of current margin windows for determining the logic state of a magnetic element during a read operation of a device. In particular, the difference in current levels between the designated target bit line and the upper and lower dashed lines, respectively, may represent different logic states for a magnetic element. More specifically, current levels between the designated target bit line current level and the current level at the upper dashed line may represent current levels which are representative of a parallel magnetic state or a logic state "0". In contrast, current levels between the designated target bit line current level and the current level at the lower dashed line may represent current levels which are representative of an antiparallel magnetic state or a logic state "1". In some cases, the designated target bit line current level may be the midpoint between the upper and lower dashed lines as shown by the dotted line in FIGS. 9c and 9d. In other embodiments, the designated target bit line current level may be at a level closer to the current level of the upper dashed line or the lower dashed line.

In any case, reference voltage levels for VMLREF and VMHREF may be associated with the read current margin windows. In particular, a change in reference voltages VMLREF and VMHREF may be indicative of the breadth of the current margin window. Consequently, altering reference voltages VMLREF and VMHREF may be used to measure current margin windows for magnetic elements within MRAM device 10. In general, it is beneficial to have a current margin window that is large enough such that a logic state of the magnetic element may be reliably read. However, variations within magnetic elements may cause current margin windows for read operations of magnetic elements to be reduced to a range at which a logic state may not be reliably read from a magnetic element. In some cases, the current margin window may be reduced to a range at which a logic state may be correctly read during some operations of the device, but may fail to read a logic state correctly at other times. Such a scenario may be particularly undesirable in cases in which an MRAM device passes a test operation, but fails in production operations, such as those employed by a customer of the device.

Incorporating adjustable read margin mode 38 within MRAM device 10 to alter the amount of current through bit line 60 during a read operation may advantageously provide a manner with which to detect magnetic elements which generate small current margin windows. In cases in which the logic state of magnetic element 126 is correctly read during such an alteration of current, the reliability of MRAM device 10 may be more certain than in cases in which the current along bit line 60 is not altered during a test operation. Consequently, it may be advantageous to employ adjustable read margin mode 38 within MRAM device 10 in some cases. In other embodiments, however, read margin mode 38 may be omitted from MRAM device 10. In particular, the inclusion of such circuitry is not necessarily needed for the operation of MRAM 10.

Figure 10:
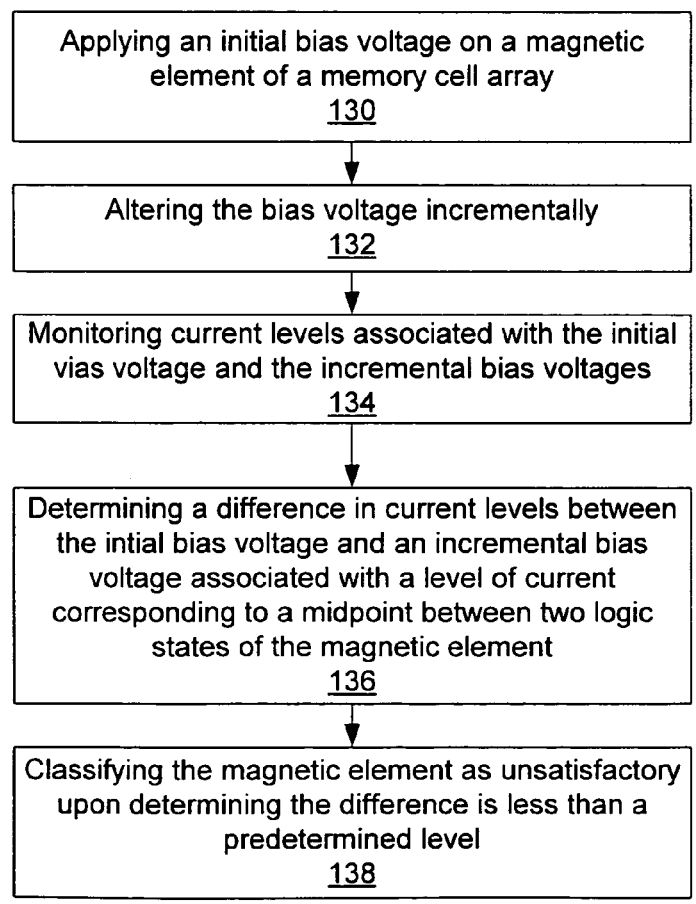
FIG. 10 depicts a flowchart of an exemplary method for identifying magnetic elements with small read current windows within the MRAM device of FIG. 1.

A flowchart outlining an exemplary method for identifying magnetic elements with small current windows is illustrated in FIG. 10 and discussed in reference to FIGS. 9a-9d. As shown in FIG. 10, the method may include block 130 in which an initial bias voltage is applied on a magnetic element of a MRAM device causing current to flow through a selected magnetic element. Such a process may be representative of the application of VMLREF or VMHREF as discussed above in referent to FIGS. 9a and 9b, respectively. As shown in blocks 132 and 134 of FIG. 10, the method may include altering the bias voltage incrementally and monitoring current levels associated with the initial bias voltage and the incremental bias voltages. In particular, block 132 may include incrementally altering a bias voltage such that current is increased or decreased along a bit line of the device. As noted above, FIGS. 9c and 9d illustrate exemplary graphs of current IBL versus applications of voltage references VMLREF and VMHREF, respectively. As shown by curves 140 and 142 in FIGS. 9c and 9d, respectively, current IBL is tracked with the change of voltage applications from VMLREF and VMHREF. In particular, curve 140 illustrates the reduction of bit line current as voltage reference VMLREF decreases. Curve 142, on the other hand, illustrates an increase in bit line current as voltage reference VMHREF increases.

As noted above, the difference in IBL current between the designated target bit line and the upper and lower dashed lines of FIGS. 9c and 9d may represent the current margin windows for different logic states of a magnetic element. In addition, a change in reference voltages VMLREF and VMHREF may be indicative of the breadth of the current margin window. As such, the difference between IBL current levels at the initial bias voltage application and the points at which curves 140 and 142 intersect the designated target bit line current (denoted as the dotted line in FIGS. 9c and 9d) may be representative of the current margin window for sensing the logic state of magnetic element 126. As such, the method outlined in the flowchart of FIG. 10 may include block 136 in which a difference in current levels between the initial bias voltage and an incremental bias voltage associated with a level of current corresponding to a midpoint between two logic states of the magnetic element is determined. The method further includes block 138 in which the magnetic element is classified as unsatisfactory upon determining the difference determined in block 136 is less than a predetermined level. For example, upon determining that the read current margin window for a magnetic element is less than approximately 2 μA, the magnetic element may be identified as unsatisfactory and may be discarded and/or replaced, improving the reliability of the device. In other embodiments, the read current margin window for the magnetic element may be determined to be greater than a predetermined level and, consequently, the magnetic element may be classified as satisfactory.

The aforementioned circuits and methods involve altering applications of current along bit and/or digit lines of an LAM device. In some embodiments, however, it may be advantageous to have MRAM device 10 include circuitry configured to terminate applications of current along the bit and/or digit lines. For example, during a power supply failure, it may be advantageous to terminate a write operation such that incorrect data is not programmed into MRAM device 10. In particular, during a power supply failure, the voltage supplied to MRAM device 10 may drop below a level at which a sufficient amount of current can be generated to switch the magnetization of selected magnetic elements. Consequently, incorrect data may be written to magnetic memory arrays 12, reducing the reliability of the device.

Figure 11:
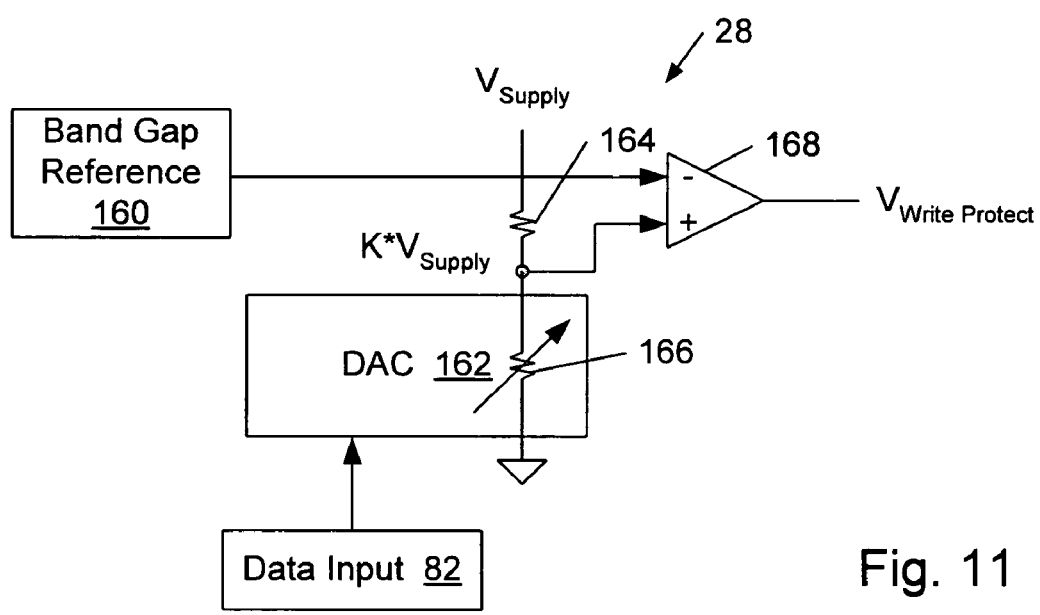
FIG. 11 depicts exemplary circuitry for write protect circuit included within the MRAM device of FIG. 1.

Such a system failure may be prevented, however, by including a circuit within MRAM device 10 that is configured to terminate applications of current along bit and/or digit lines before the magnetization states of one or more magnetic elements selected for a write operation of the device are changed. For example, MRAM device 10 may include write protect 28 as shown in FIG. 1. An exemplary circuit for write protect 28 is illustrated in FIG. 11 and described in more detail below. Other circuitry may be used for write protect 28, however, depending on the design specifications of MRAM device 10. In particular, write protect 28 may include any circuitry which is configured to monitor a power supply voltage to MRAM device 10 and terminate applications of current along bit and/or digit lines of magnetic memory arrays 12 upon determining the power supply voltage is below a predetermined threshold.

In general, the predetermined supply threshold may depend on the operating parameters of MRAM device 10. An exemplary supply threshold that may be particularly applicable to MRAM devices that include magnetic tunnel junction magnetic elements may be less than approximately 5.0 volts, or more specifically, less than approximately 4.5 volts. Larger or smaller thresholds may be appropriate as well. As shown in FIG. 1, write protect 28 may be coupled to north bit line pulse generator 22, south bit line pulse generator 58 and digit line pulse generator 56. In other embodiments, write protect 28 may be coupled to less than all of north bit line pulse generator 22, south bit line pulse generator 58 and digit line pulse generator 56. In yet other embodiments, write protect 28 may be omitted from MRAM device 10. In particular, the inclusion of write protect 28 is not necessarily needed for the operation of MRAM device 10.

As noted above, an exemplary circuit for write protect 28 is illustrated in FIG. 11. In particular, FIG. 11 depicts a circuit including band gap reference 160, resistors 164 and 166, DAC 162 and Op Amp 168. Write protect 28 may operate by multiplying supply voltage $V_{supply}$ by a ratio of resistances from resistors 164 and 166. In some embodiments, the ratio of resistances may equal the resistance of resistor 164 divided by the composite resistance of both resistors (i.e., $R_{164}/(R_{164}+R_{166})$). The altered voltage supply is depicted as $K^*V_{supply}$ in FIG. 11. The altered voltage supply may be compared to a precision band gap voltage provided by band gap reference 160 at Op Amp 168. When the altered voltage supply reaches the low voltage threshold level, the voltage from Op Amp 168 may be sent to north bit line pulse generator 22, south bit line pulse generator 58 and/or digit line pulse generator 56 to terminate the application of current along bit and/or digit lines of MRAM device 10. Since resistor 166 is part of DAC 162, the resistance of resistor 166 may be adjusted by data input 82, allowing the voltage level threshold at which write protect 28 terminates applications of current to be adjustable. In general, data input 82 which may include laser fuses, metal mask options or data transmitted from a magnetic element storage latch arranged within MRAM device 10.

Figure 12:
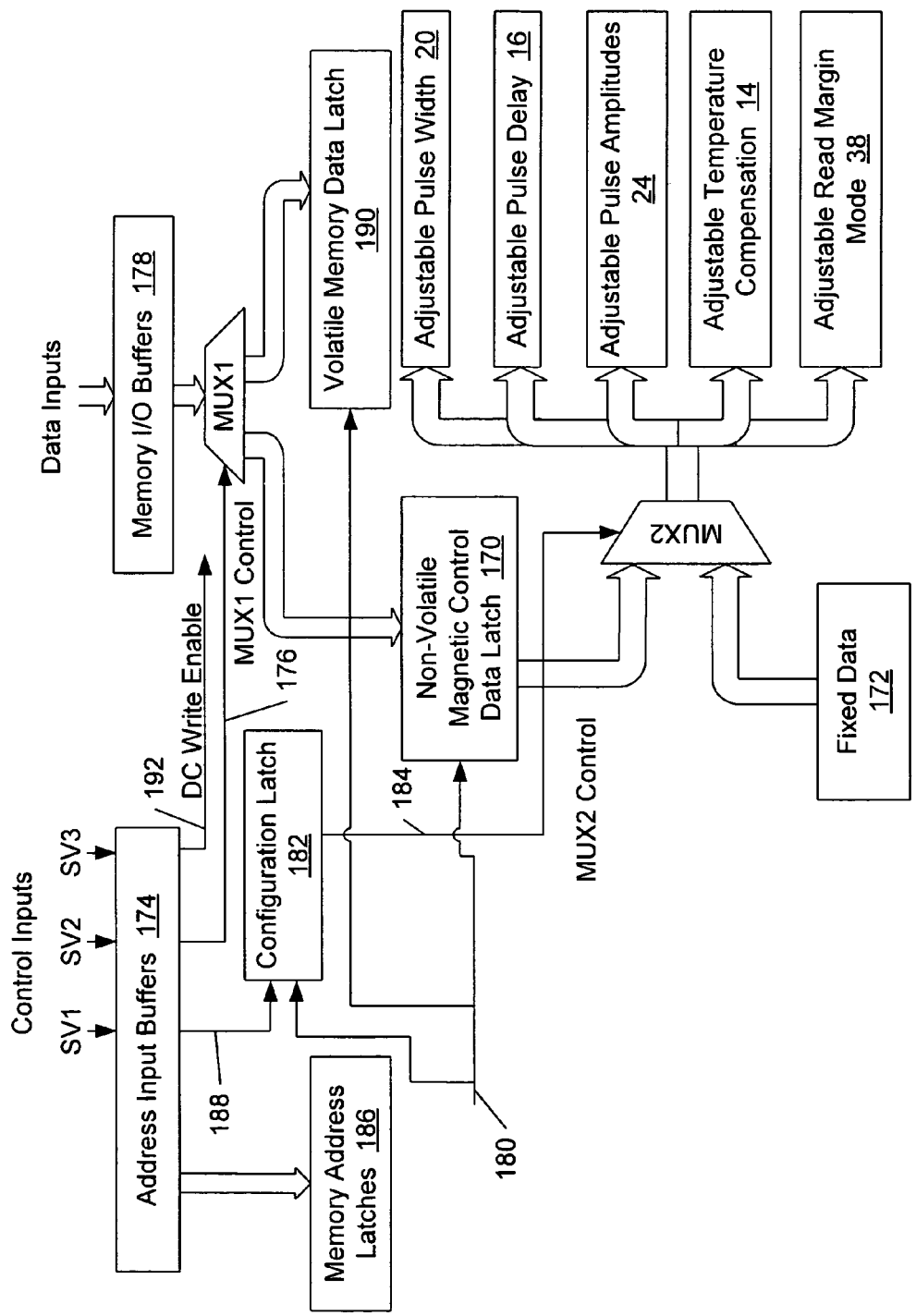
FIG. 12 depicts an exemplary layout of data and control signal routes for the MRAM device of FIG. 1.
Figure 13:
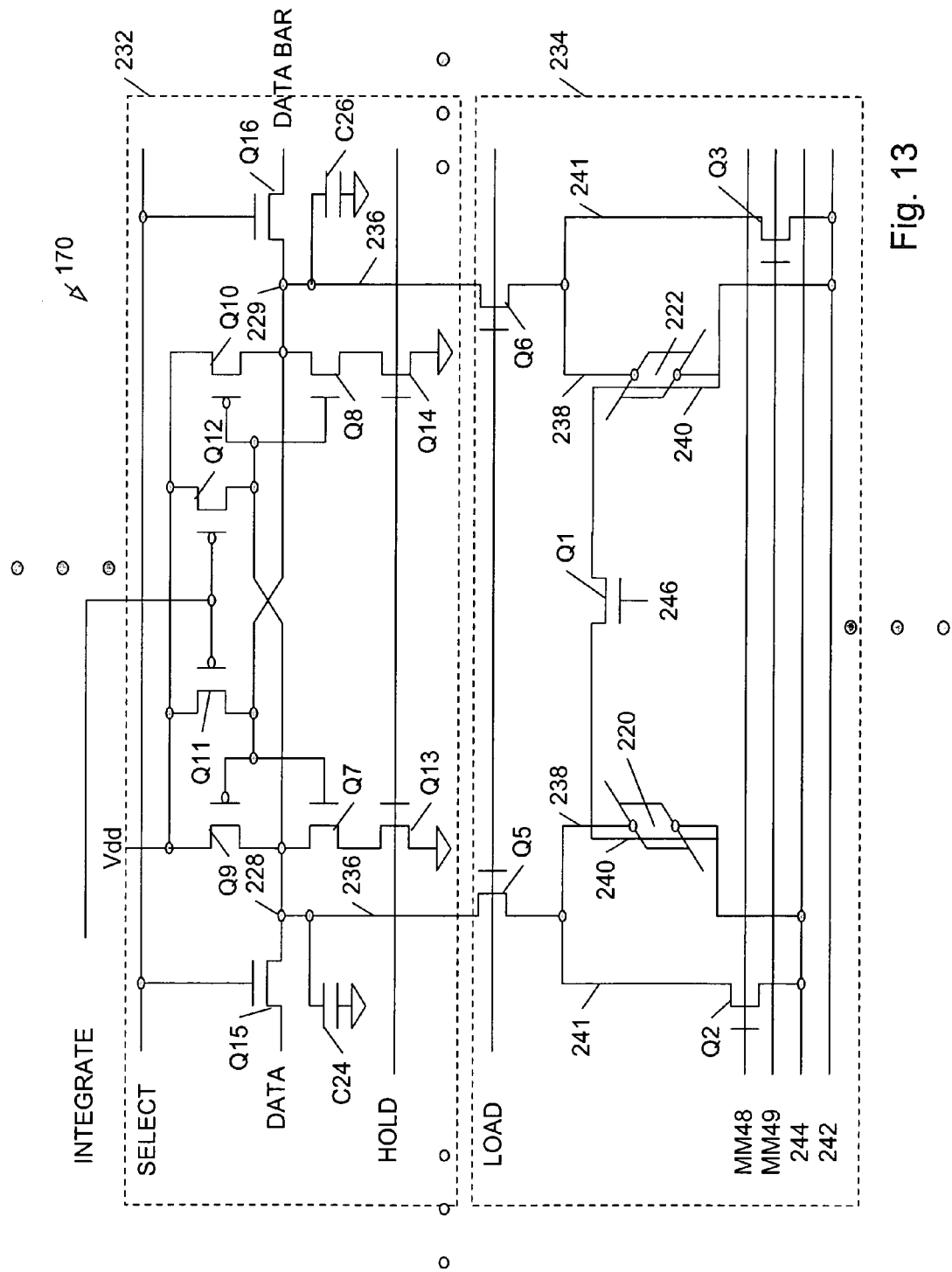
FIG. 13 illustrates an electrical schematic diagram of a latch including magnetic elements.

A block diagram illustrating data routes and control signal routes of MRAM device 10 is illustrated in FIG. 12. In particular, FIG. 12 illustrates address input buffers 174 coupled to memory address latches 186 such that specific magnetic elements within magnetic memory arrays 12 may be addressed for operations. FIG. 12 further shows lines extending from address input buffers 174 to send control signals to magnetic configuration latch 182 and multiplexor MUX1. In particular, control line 188 may be used to send a signal to activate configuration latch 182. In addition, control line 176 may be used to send a signal to multiplexor MUX 1. In general, control line 176 may be used to control the direction data provided to multiplexor MUX 1 is sent. Control line 192 may be used to send a signal by which to activate an extended write operation of a magnetic memory array as described above in reference to FIG. 5. Signals may be forwarded along control lines 188, 176 and 192 when address input buffers 174 receives a voltage higher than a voltage level of a power supply coupled to the MRAM device represented as SV1, SV2 and SV3 in FIG. 12, respectively.

As shown in FIG. 12, data from memory I/O buffers 178 may be sent to magnetic control data latch 170 or volatile memory data latch 190. A control signal may be sent along line 180 to enable the operation of magnetic control data latch 170 and volatile memory data latch 190 as well as configuration latch 182. Configuration latch 182 may be used to send a control signal along line 184 by which to control the direction data provided to multiplexor MUX 2 is sent. As shown in FIG. 12, data from magnetic control data latch 170 or fixed data 172 may be sent to one or more of adjustable pulse width 20, adjustable pulse delay 16, adjustable temperature compensation 14, adjustable read margin mode 38 and adjustable pulse amplitudes 24 for north bit line pulse generator 22, south bit line pulse generator 58 and/or digit line pulse generator 56.

In general, fixed data 172 may include laser fuses and/or metal mask options by which to store parameter settings for MRAM device 10. As noted above, however, settings within laser fuses and metal mask options are fixed (i.e., can only be programmed once) and, therefore, are generally difficult to provide a variety of settings to a magnetic memory array for testing. Magnetic control data latch 170, however, is reprogrammable and, therefore, may be configured to store a variety of different parameter settings characterizing operations of MRAM device 10 even after the device is packaged. In general, magnetic control data latch 170 may include one or more magnetic elements and circuitry with which to produce complementary outputs that are stable in one of two logic states. Exemplary configurations and methods of operation of magnetic control data latch 170 are shown in FIGS. 13-18 and discussed in more detail below. It is noted that configuration latch 182 may include a similar configuration as control data latch 170. In particular, configuration latch 182 may include one or more magnetic elements by which to send a control signal to multiplexor MUX2. As such, the description of the circuitry described in reference to FIGS. 13-18 may be applied to configuration latch 182 as well. In yet other embodiments, configuration latch 182 may not include magnetic elements. In such embodiments, configuration latch 182 may include any circuitry with which to form a non-volatile or volatile latch.

As discussed in more detail below, magnetic control data latch 170 may serve as a non-volatile means by which to store parameter settings for MRAM device 10. In some embodiments, the parameter settings stored within magnetic control data latch 170 may be used for testing qualitative features of MRAM device 10 and, therefore, may be adjusted in some cases to accommodate the adjustable circuits described above. In other cases, however, the parameter settings stored within magnetic control data latch 170 may be stored for use by a consumer of MRAM device 10 and, therefore, may be fixed. Alternatively, the fixed parameter settings may be stored within fixed data 172, which as noted above, may include laser fuses and/or metal mask options. As shown in FIG. 12, MRAM device 10 may include both magnetic control data latch 170 and fixed data 172. As such, MRAM device 10 may include more than one means by which to store parameter settings for the operation of the device. In yet other embodiments, one of magnetic control data latch 170 and fixed data 172 may be omitted from MRAM device 10. In particular, the inclusion of both magnetic control data latch 170 and fixed data 172 is not necessarily needed for the operation of MRAM 10.

An exemplary embodiment of a memory storage circuit for control data latch 170 is illustrated in FIG. 13. In particular, FIG. 13 illustrates control data latch 170 comprising volatile portion 232 coupled to nonvolatile portion 234. Volatile portion 232 and nonvolatile portion 234 are outlined by dotted lines to distinguish the collection of components within control data latch 170 which are configured to store bits solely in the presence of power as well as with and without the presence of power, respectively. The placement of the dotted-line boundaries are arbitrary and, therefore, the size of volatile portion 232 and nonvolatile portion 234 are not restricted to the dotted lines themselves. In addition, the dotted lines are not included as components within control data latch 170 and, thus, do not serve a function within the latch. Although FIG. 13 illustrates control data latch 170 having one volatile portion and one nonvolatile portion, control data latch 170 may include any number of complementary coupled volatile and nonvolatile portions as indicated by the continuation dots arranged along the periphery of control data latch 170. The aforementioned discussion of dotted lines and continuation dots are applicable to the embodiment of control data latch 170 illustrated in FIG. 18 as well. In addition, it is noted that the terms "memory storage circuit" and "latch" may be used interchangeably herein.

As shown in FIG. 13, nonvolatile portion 234 may include magnetic elements 220 and 222. In general, magnetic elements 220 and 222 may each include any compilation of layers, including some with magnetic properties, which are collectively configured to store bits in a first logic state or a second logic state. In particular, magnetic elements 220 and 222 may each include materials having magnetic vectors oriented in a parallel fashion or in an antiparallel fashion, corresponding to a low resistance state and a high resistance state, respectively. For example, magnetic elements 220 and 222 may include magnetic tunnel junctions or giant magnetoresistance junctions. It is noted that in cases in which magnetic elements 220 and 222 comprise giant magnetoresistance junctions, control data latch 170 may have a different configuration than what is shown in FIG. 13. In either case, magnetic elements 220 and 222 may be configured to change their logic states by exposure to magnetic fields induced about the magnetic elements. Consequently, nonvolatile portion 234 may include one or more conductive structures by which to induce a magnetic field about magnetic elements 220 and 222. In particular, nonvolatile portion 234 may include conductive paths 240 arranged adjacent to magnetic elements 220 and 222 as shown in FIG. 13. An exemplary configuration of conductive paths 240 is described in more detail below in reference to FIG. 16.

In some cases, control data latch 170 may include program transistor Q1 interposed between portions of conductive paths 240 which are respectively arranged adjacent to magnetic elements 220 and 222. In such embodiments, the same current may be used to induce a magnetic field about magnetic elements 220 and 222. In particular, an application of voltage to a gate of program transistor Q1 may enable current flow between portions of conductive paths 240 corresponding to magnetic elements 220 and 222. As shown in FIG. 13, conductive paths 240 may be coupled to current source lines 242 and 244. In an embodiment in which an appropriate amount of voltage is applied to program transistor Q1, either current source line 242 or 244 may be used to supply current through conductive paths 240 and the other of current source lines 242 and 244 may serve as a ground line. In general, the term "program transistor", as used herein, may refer to a transistor coupled to a series of conductive structures used to induce a magnetic field about a magnetic element for setting the magnetic direction of the magnetic element. As such, control data latch 170 may, in some embodiments, include distinct program transistors coupled to each of conductive paths 240 corresponding to magnetic elements 220 and 222. In such an embodiment, conductive lines 240 may not be coupled to one another, but may lead to ground subsequent to passing through their respective program transistors.

In either case, nonvolatile portion 234 may, in some embodiments, be configured to have magnetic elements 220 and 222 serve as a differential pair of magnetic elements. In particular, nonvolatile portion 234 may be configured such that magnetic elements 220 and 222 may be set in opposing logic states. An exemplary embodiment of nonvolatile portion 234 having such a configuration is described in more detail below in reference to FIG. 16. In other embodiments, nonvolatile portion 234 may be configured to have a single magnetic element, which may be used in conjunction with reference magnetic elements. In general, the plurality of reference magnetic elements may be arranged external to nonvolatile portion 234 and may be used for comparing the logic states of all of the magnetic elements arranged within control data latch 170. Consequently, in such an embodiment, the loading of data from nonvolatile portion 234 to volatile portion 232, as described in more detail below, may include loading data from the magnetic element within nonvolatile portion 234 and the plurality reference magnetic elements arranged external to the nonvolatile portion. In an embodiment in which magnetic elements 220 and 222 serve as a differential pair of elements, loading data from nonvolatile portion 234 to volatile portion 232 may include loading data from magnetic elements 220 and 222 to nodes 228 and 229, respectively, as described in more detail below.

As shown in FIG. 13, magnetic elements 220 and 222 may be coupled to a plurality of transistors within volatile portion 232. Such a plurality of transistors may be collectively coupled to store bits in both a first logic state and a second logic state. More specifically, transistors Q7-Q14 may be collectively configured to store bits of opposite logic states at nodes 228 and 229. In some cases, control data latch 170 may be configured to load bits from magnetic elements 220 and 222 into the plurality of transistors within nonvolatile portion 232. In particular, control data latch 170 may include conductive paths 236 and 238 as well as transistors Q5 and Q6 with which to emulate the opposing logic states of magnetic elements 220 and 222 at nodes 228 and 229, respectively. More specifically, conductive paths 238 may be coupled to transistors Q5 and Q6, which are in turn coupled to conductive paths 236. Conductive paths 236 extend up to nodes 228 and 229 such that upon an application of a bias voltage along LOAD line, transistors Q5 and Q6 may turn on and enable current flow through conductive paths 238.

In general, conductive paths 238 may include a set of structures configured to pass current through magnetic elements 220 and 222. In this manner, data sent to volatile portion 232 may be representative of the logic states (i.e., resistance levels) within magnetic elements 220 and 222. An exemplary configuration of a set of structures for conductive paths 238 is described in more detail below in reference to FIG. 17. In addition, a more detailed description of the sequence of steps for loading bits from magnetic element 220 and 222 to nodes 228 and 229 is provided below in reference to FIGS. 14 and 15. In some embodiments, the plurality of transistors within volatile portion 232 may be loaded from a source other than nonvolatile portion 234, such as DATA and DATABAR lines, for example. In such embodiments, a low voltage application along SELECT line may be used to enable transistors Q15 and Q16 to flow current to the plurality of transistors within volatile portion 232.

In light of the different adaptations of conductive paths 238 and 240 to respectively conduct current through and adjacent to magnetic elements 220 and 222, the lines representing the conductive structures of conductive paths 238 and 240 in FIG. 13 are illustrated in different schematic manners relative to magnetic elements 220 and 222. In particular, the lines representing conductive paths 238 are shown coupled to two opposing sides of magnetic elements 220 and 222. Consequently, the portions of conductive paths 238 traversing through magnetic elements 220 and 222 are not depicted with a line. The lines representing conductive paths 240, on the other hand, are shown extending from current source 242 or 244 to program transistor Q1, with the portions adjacent to magnetic elements 220 and 222 shown.

Figure 14:
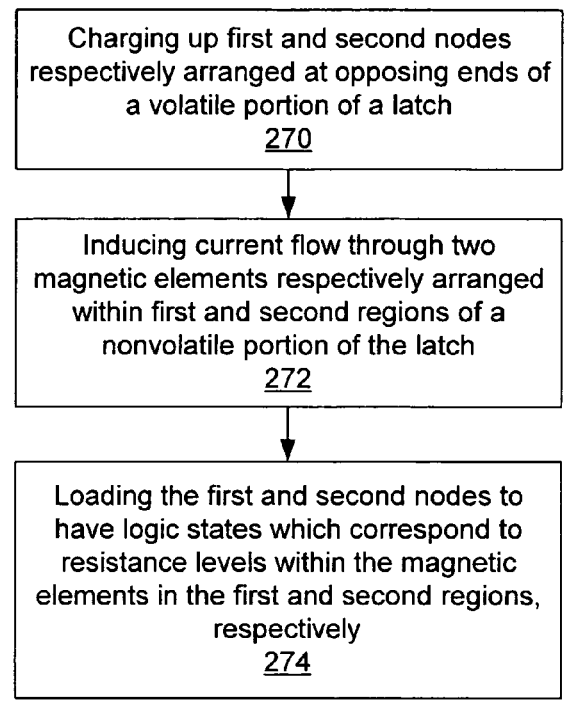
FIG. 14 illustrates a flowchart outlining a method for operating the latch of FIG. 13.
Figure 15:
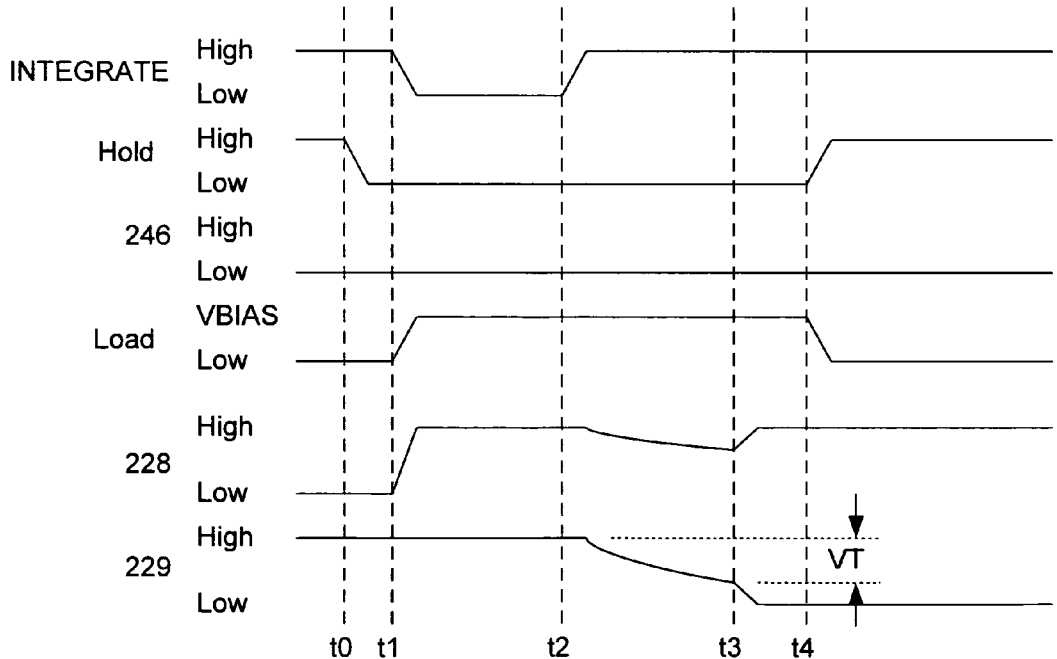
FIG. 15 illustrates a timing chart of voltage applications along different lines and nodes within the latch of FIG. 13 during a load operation.

As noted above, a detailed description of the process of loading data from nonvolatile portion 234 to volatile portion 232 is described in reference to FIGS. 14 and 15. In particular, FIG. 14 illustrates a flow chart outlining such a process and FIG. 15 illustrates a timing chart of the application of voltages along different lines and nodes within control data latch 170 during the load operation. As shown in FIG. 15, at time t0, a low application of voltage may be applied to HOLD line, releasing data stored within volatile portion 232. At time t1, a low application of voltage may be applied to INTEGRATE line, turning on PMOS transistors Q11 and Q12 to charge up nodes 228 and 229. Such a charging up process is referred to in FIG. 14 as block 270. The loading process further includes block 272 in which current flow is induced through two magnetic elements of a nonvolatile portion of the latch. Such a process is referenced at time t1 in FIG. 15 by increasing the voltage along LOAD line to a bias voltage, which is specifically configured to incur a voltage on the gates of NMOS transistors Q5 and Q6 that limits the amount of voltage applied to magnetic elements 220 and 222. Such a limited voltage may advantageously prevent a breakdown of the tunnel junction within magnetic elements 220 and 222.

In general, the resistance sensed through magnetic elements 220 and 222 may be a function of the bias voltage applied to LOAD line. Variations within magnetic elements, however, may cause a breakdown voltage of a tunneling layer of magnetic element to be low in some embodiments. Low breakdown voltages may, in some cases, cause in load failures, reducing the reliability of the latch. In some embodiments, different voltage levels may be applied along LOAD line to vary the amount of current passing through transistor Q5 and Q6 during different test operations of control data latch 170. In this manner, magnetic elements within control data latch 170 having low breakdown voltages may be detected and discarded, improving the reliability of the device. In addition, varying the application of voltage along LOAD line may allow an optimum bias voltage to be determined for nonvolatile portion 234.

Although FIG. 15 illustrates the timing of bringing INTEGRATE line low (corresponding to charging up nodes 228 and 229) and bringing LOAD line to a bias voltage (corresponding to inducing current flow through magnetic elements 220 and 222), the two processes may alternatively be conducted at different times. In particular, LOAD line may, in some embodiments, be brought to a bias voltage subsequent to decreasing the voltage application along INTEGRATE line. In either case, the bias voltage along LOAD line is preferably applied before an application of voltage along INTEGRATE line is brought high at time t2. Bringing INTEGRATE line high may release the charge at nodes 228 and 229 as noted in FIG. 15 slightly subsequent to time t2.

In particular, the voltage levels at nodes 228 and 229 may start to decrease gradually subsequent to time t2 as shown in FIG. 15.

In an embodiment in which magnetic element 220 is in a high resistance state and magnetic element 222 is in a low resistance state, a smaller amount of current through magnetic element 220 will be conducted through magnetic element 220 as compared to magnetic element 222. Consequently, capacitor C26 will be discharged faster than capacitor C24. At a time when the voltage at node 229 reaches a threshold voltage VT of transistor Q9 (e.g., time t3 as noted in FIG. 15), node 228 will be pulled high (i.e., logic state "1") by transistor Q9, regeneratively turning off transistor Q10. In addition, node 229 will be pulled low (i.e., logic state "0") by the current through magnetic element 222. It is noted that rate of discharge of capacitor C24 and C26 will be reversed when magnetic element 220 is in a low resistance state and magnetic element 222 is in a high resistance state. In such an embodiment, node 229 will be pulled high when node 228 reaches a threshold voltage VT of transistor Q10, regeneratively turning off transistor Q9. As a result node 228 will be pulled low by the current through magnetic element 220. In either case, HOLD line may be brought high at time t4, turning on transistors Q13 and Q14 such the data is set within volatile portion 232. At the same time or subsequent to the application of voltage along the gates of Q13 and Q14, LOAD line may be turned low turning off transistors Q5 and Q6 and removing the bias from magnetic elements 220 and 222.

As shown in FIG. 13, control data latch 170 may be substantially absent of cross-over lines between magnetic elements 220 and 222 and nodes 228 and 229. More specifically, control data latch 170 may include distinct lines extending between magnetic elements 220 and 222 and nodes 228 and 229 which do not overlap within the topography of the latch. In this manner, the logic states stored within magnetic elements 220 and 222 may be directly loaded into nodes 228 and 229, respectively. In other words, nodes 228 and 229 may be loaded with logic states that respectively correspond to the resistance levels stored within the magnetic elements 220 and 222 as noted in block 274 of FIG. 14. Some conventional latches require data stored within a nonvolatile portion of the latch to be loaded to opposite sides of a volatile portion of the latch, thus, requiring cross-over lines. Such cross-over lines occupy valuable space within a latch. Consequently, the latch described herein may occupy less area within a device than a conventional latch which includes cross-over lines.

Figure 16:
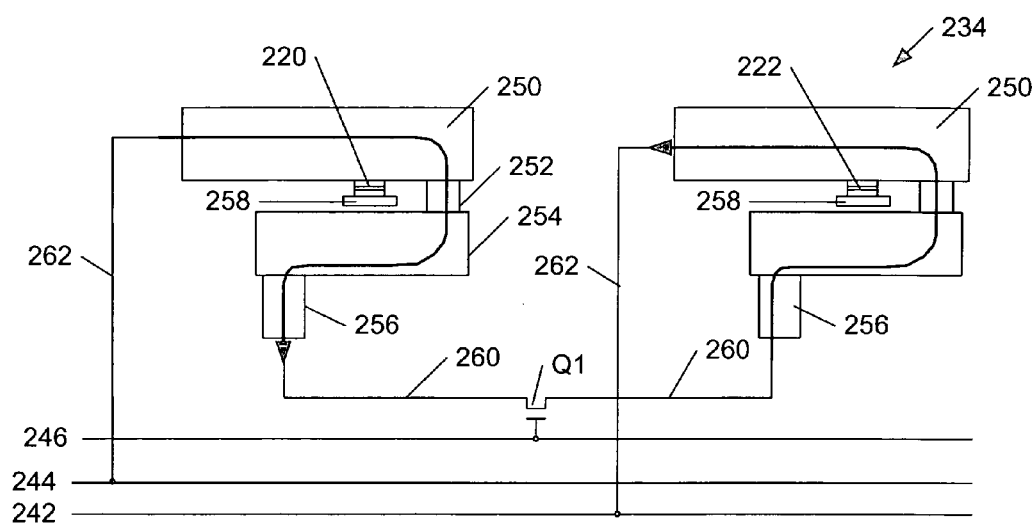
FIG. 16 illustrates an electrical schematic diagram depicting exemplary layouts of structures constituting portions of conductive paths within a nonvolatile portion of the latch of FIG. 13.
Figure 17:
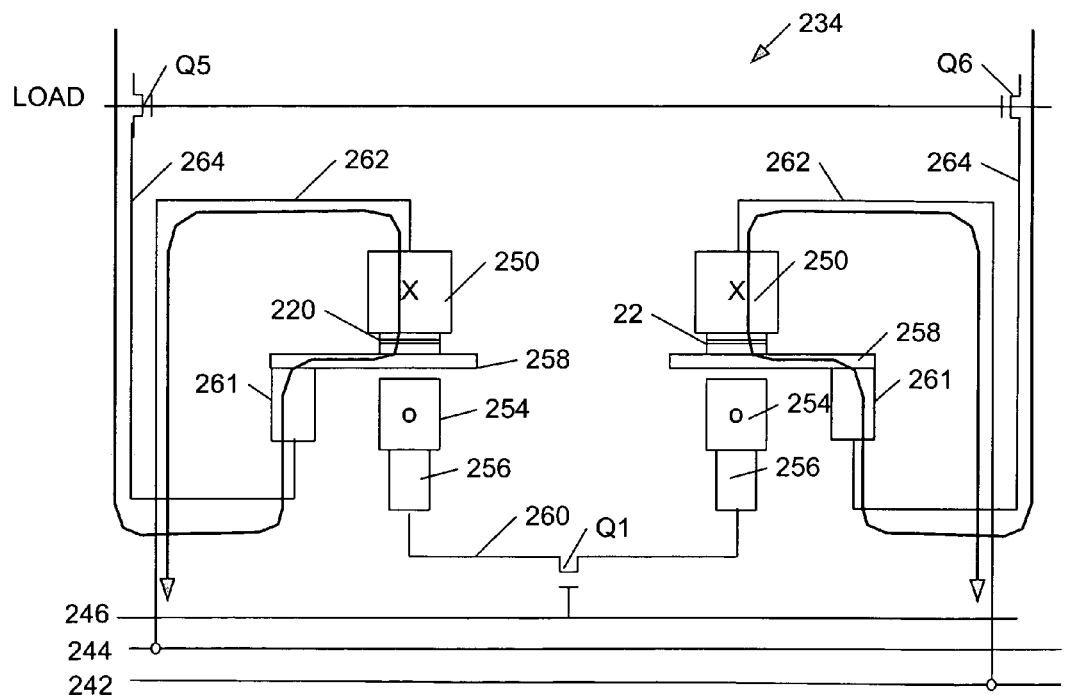
FIG. 17 illustrates an electrical schematic diagram depicting a different cross-sectional view of the layout of structures constituting the portions of conductive paths in FIG. 16.

FIGS. 16 and 17 illustrate an exemplary configuration of conductive structures arranged about magnetic elements 220 and 222 which may constitute conductive paths 238 and 240. In particular, FIGS. 16 and 17 illustrate schematic views of nonvolatile portion 234 depicting exemplary layouts of structures constituting portions of conductive paths 238 and 240. As shown in FIGS. 16 and 17, nonvolatile portion 234 may include conductive structures 250 and 254, vias 252, 256 and 261 and electrodes 258 arranged adjacent to magnetic element 220 and 222. Although FIGS. 16 and 17 illustrate different cross-sectional views for the arrangement of conductive structures 250 and 254, vias 252, 256 and 261, electrodes 258 around magnetic elements 220 and 222, FIGS. 16 and 17 are illustrated as schematic drawings and, therefore, do not relate the position of magnetic elements 220 and 222 with respect to those different cross-sectional views. FIGS. 16 and 17 are merely illustrated to show exemplary configurations conductive paths 238 and 240 as well as exemplary current paths that may be used when programming and loading data from magnetic elements 220 and 222. In addition, it is noted that margin mode circuit lines MM48 and MM49, transistors Q5 and Q6 and conductive lines 241, described in more detail below, are not shown in FIG. 16 or 17 to simplify the drawings. Such components may be included within the embodiments described in reference to FIGS. 16 and 17 or may be omitted from control data latch 170 in some cases.

The arrangement of conductive structures 250 and 254, vias 252 and 256 and one or more other conductive structures coupled thereto may generally constitute conductive path 240. In particular, conductive structures 250 and 254 may be connected by vias 252 such that a magnetic field may be induced about magnetic elements 220 and 222. In addition, conductive structures 254 may be coupled to vias 256, which are in turn coupled to one or more conductive structures denoted as conductive lines 260 in FIG. 16. In some embodiments, the one or more conductive structures may be coupled to program transistor Q1 as shown in FIG. 16. In other embodiments, the one or more conductive structures may be coupled to ground lines. In either case, conductive paths 240 may include one or more conductive structures interposed between conductive structure 250 and current sources lines 242 and 244, denoted as conductive line 262 in FIG. 16.

The conductive structures along conductive line 262 may also constitute conductive path 238, along with conductive structure 250, magnetic elements 220 and 222, electrodes 258, vias 261 and the other conductive structures coupled to transistors Q5 and Q6, denoted as conductive line 264 in FIG. 17. For such a configuration, conductive structures 250 are preferably arranged in contact with magnetic elements 220 and 222 such that the current may be conducted therethrough. In other embodiments, however, conductive structures 250 may be spaced above magnetic elements 220 and 222 and coupled thereto by vias. In either case, conductive structures 250 may be referred to bit lines in some embodiments since they are used for the programming and loading operations of control data latch 170. It is noted that the series of conductive structures constituting conductive paths 238 and 240 may be altered from the illustrations depicted in FIGS. 16 and 17. For example, in some embodiments, conductive structures 250 may be aligned with the lower side of magnetic elements 220 and/or 222 and conductive structures 254 may be aligned with the upper side of magnetic elements 220 and/or 222. In such an embodiment, the arrangement of vias 252 and 256 may be altered such that conductive paths 240 may run under and then above magnetic elements 220 and/or 222 down to one or more program transistors. In addition, electrodes 238 and vias 261 may be arranged above magnetic elements 220 and 222 in such an embodiment.

In any case, conductive structures 250 and 254 may, in some embodiments, be arranged such that conductive path 240 includes two distinct segments arranged adjacent to opposing sides of magnetic elements 220 and 222. Such an arrangement of structures may generally be referred to herein as a "loop around" or "fold back" configuration and is described in more detail below. In yet other embodiments, conductive paths 240 may include a series of conductive structures which do not loop around magnetic elements 220 and 222. In particular, conductive paths 240 may, in some embodiments, include one or more conductive structures arranged along one side of magnetic elements 220 and 222 and may be substantially absent of structures along the opposing side of the magnetic elements. Such a configuration of conductive paths 240 may be referred to herein as a non-fold back configuration.

In some embodiments, nonvolatile portion 234 may include conductive structures which are arranged adjacent to such opposing sides of magnetic elements 220 and 222, but are not included in the series of structure within conductive paths 240. Such additional structures may be spaced apart from magnetic elements 220 and 222. In addition, the additional structures may be oriented to conduct current in a direction which is orthogonal to the direction of current flow through conductive structures 250, thereby providing sets of cross-hatched conductive lines adjacent to magnetic elements 220 and 222. In any case, the magnitude of magnetic fields generated from non-fold back configurations are discussed in more detail below relative to the magnitude of magnetic fields generated from conductive paths with a fold back arrangement. In addition, the voltage requirements for non-fold back configurations are discussed in more detail below relative to fold back arrangements.

As noted above, conductive structures 250 and 254 may be aligned along opposing sides of magnetic elements 220 and 222 to create a fold back or loop around configuration. In some cases, conductive structures 250 and 254 may be aligned parallel to one another as shown in FIG. 16. In other cases, however, conductive structures 250 and 254 may be angled relative to each other. As noted above, conductive structures 250 and 254 may be coupled together by vias 252. Consequently, the direction of current flow within conductive structures 250 and 254 may be different relative to each other and, in some cases, directly opposite from each other. For example, conductive structure 250 adjacent to magnetic element 220 may include direction of current flow to the right, while conductive structure 254 adjacent to magnetic element 220 may include direction of current flow to the left when current flow is induced from 244 to 242. Alternatively, conductive structure 250 may have a direction of current flow to the left and conductive structure 254 may have a direction of current flow to the right when current flow is induced from 242 to 244 around magnetic element 220.

In any case, the configuration of conductive path 240 to fold back or loop around magnetic elements 220 and 222 may advantageously increase the magnetic field induced about the elements. In particular, the arrangement of conductive structures 250 and 254 aligned along opposing sides of magnetic elements 220 and 222 and connected by vias 252 may approximately double the magnetic field induced about the magnetic elements relative to an embodiment in which conductive path 240 is not configured to fold back or loop around magnetic elements 220 and 222. In some cases, the fold back or loop around configuration may offer an even larger magnetic field relative to latches including cross-hatched conductive lines adjacent to magnetic elements 220 and 222. In particular, the magnitude of the magnetic field induced by a fold back or loop around configuration may be approximately 2.8 times larger than a magnetic field induced by a configuration of cross-hatched conductive lines in some embodiments. The calculation of the factor of 2.8 is computed from an embodiment in which the amount of current applied to cross-hatched conductive lines are equal and the same total amount of current is applied to a loop around configuration of conductive paths 240. In some cases, however, the same amount of current may not be applied to cross-hatched conductive lines while programming a latch. As such, the factor used to show the relative magnitudes of magnetic fields generated by a latch with fold back conductive paths versus magnetic fields generated by a latch with cross-hatched conductive lines may be smaller or larger than approximately 2.8 in some embodiments.

In any case, for a given amount of current, the effective current through a conductive path having a fold back configuration may be larger than the effective current generated from a conductive path which does not include a fold back configuration. As a result, the loop around configuration of conductive structures 250 and 254 may, in some embodiments, reduce the amount of current used to operate control data latch 170 relative to an embodiment in which conductive path 240 does not include a loop around configuration. As noted above, the magnetic field induced from a fold back configuration of conductive structures 250 and 254 is considerably larger than the magnetic field induced by a configuration in which conductive structures 250 and 254 are not arranged to loop around magnetic elements 220 and 222. In addition, the magnetic field induced from a fold back configuration of conductive structures 250 and 254 is considerably larger than the magnetic field induced within a latch having cross-hatched conductive lines adjacent to magnetic elements 220 and 222.

As such, for a given magnitude of a magnetic field needed to program magnetic elements 220 and 222, a smaller amount of current may be used to operate a latch including a fold back configuration of conductive path 240 relative to a latch without such a fold back configuration for conductive path 240. For example, the amount of current used to program nonvolatile portion 234 may less than approximately 5 mA in embodiments in which conductive path 240 includes a fold back configuration. An amount of current used to program nonvolatile portion 234 having conductive path 240 without a loop around configuration may be approximately 10 mA in some embodiments. In contrast, an amount of total current used to program nonvolatile portion 234 with a configuration of cross-hatched conductive lines may be greater than approximately 15 mA in some embodiments. In any case, the overall power requirements of a latch including magnetic elements may be reduced relative to latches having non-magnetic elements with which to store bits in a nonvolatile portion.

FIG. 16 illustrates an exemplary configuration of programming magnetic elements 220 and 222 by applying a high voltage level to current source lines 244 and 246 as well as applying a low voltage current level to current source line 242. Such an application of voltages may render current to be conducted through the conductive path around magnetic element 220 to the conductive path around magnetic element 222 as shown by the boldface arrows through conductive structures 250 and 254 and vias 252 and 256. In other embodiments, a low voltage level may be applied to current source line 244 high and a high current voltage level may be applied to current source lines 242 and 246 to conduct current in the reverse direction through magnetic elements 220 and 222. In either case, applying a voltage to the gate of program transistor Q1 allows same current to flow through both of magnetic elements 220 and 222. In yet other cases, conductive paths 240 may not be joined by program transistor Q1 and conductive paths 240 may include distinct lines arranged adjacent to magnetic elements 220 and 222. In such an embodiments, a current source may be applied to lines 242 and 244 in order to induce a magnetic field about magnetic elements 220 and 222, respectively.

As noted above, magnetic elements 220 and 222 may, in some cases, be configured as a differential pair of magnetic elements such that opposing logic states are stored within the elements. Consequently, conductive paths 240 may be configured to pass current in different directions about magnetic elements 220 and 222 in some embodiments. In particular, conductive paths 240 may be configured to pass current through conductive segment 250, via 252, conductive segment 254 and via 256 around magnetic element 220 and a reverse of such a sequence of structures around magnetic element 222 as illustrated in FIG. 16. Since the direction of current through conductive structures 250 and 254 adjacent to magnetic element 220 is opposite of the direction of current through conductive structures 250 and 254 adjacent to magnetic element 222, the magnetic vectors within the magnetic elements will be oriented in different states, namely parallel or antiparallel. Other conductive routes for conductive paths 240 may be used to program magnetic elements 220 and 222 in opposing logic states as well. For example, in some cases, conductive paths 240 may be configured to pass current through conductive segment 250 adjacent to magnetic element 222 directly subsequent to passing around magnetic element 220 and through program transistor Q1. In such an embodiments, the conductive path may be further configured to continue the current flow to via 252, conductive segment 254 and via 256 around magnetic element 222. In such a case, via 252 may be arranged to the left of magnetic element 222 with respect to the perspective illustrated in FIG. 16. In addition, via 256 may be spaced below and to the right of magnetic element 222.

FIG. 17 illustrates an exemplary configuration of loading data from magnetic elements 220 and 222. As noted above, a bias voltage may be applied to LOAD line during a loading operation of control data latch 170. Such an application of a bias voltage may activate transistors Q5 and Q6 to enable current flow from nodes 228 and 229 of volatile portion 232 to magnetic elements 220 and 222 in nonvolatile portion 234 as described above in reference to FIGS. 14 and 15. In some embodiments, conductive paths 238 may be run to a designated ground line within control data latch 170. In other embodiments, however, conductive paths 328 may be configured to run such a current flow to current source lines 242 and 244 as shown in FIG. 17. In such an embodiment, current source lines 242 and 244 may serve as virtual ground lines during a loading operation of control data latch 170. The use of current source lines 242 and 244 as ground lines may advantageously eliminate the need to incorporate a ground line specified for such a use in control data latch 170. In addition, the need to have transistors configured to induce current flow to such a designated ground line may be eliminated. Consequently, the circuitry of control data latch 170 may be simplified and the amount of area it occupies may be reduced relative to embodiments in which a designated ground line and transistors are included.

In addition or alternatively, conductive paths 238 may, in some embodiments, be configured to induce current flow in a sequence from transistors Q5 and Q6 to vias 261, electrodes 258, magnetic elements 220 and 222, and conductive structures 250 and current sources lines 242 and 244 as shown by the boldface arrows following conductive paths 238 in FIG. 17. Such a configuration of conductive paths 238 may be particularly advantageous in embodiments in which current source lines 242 and 244 are commonly coupled to a plurality of magnetic elements comprising different nonvolatile portions within control data latch 170. In particular, in embodiments in which current source lines 242 and 244 are shared, the configuration of conductive paths 238 to route current flow to via 261 through conductive structure 250 may advantageously prevent nodes of different volatile portions corresponding to the different nonvolatile portions of control data latch 170 from shorting together. For example, in an embodiment in which current source line 244 is coupled to magnetic element 220 as well as another magnetic element arranged in an adjacent nonvolatile portion of control data latch 170, the configuration of conductive paths 238 may prevent nodes of different volatile portions coupled to such magnetic elements from shorting.

Returning to FIG. 13, control data latch 170 may, in some embodiments, include circuitry which is configured to alter the amount of current through conductive paths 238 during a load operation of the latch. In particular, control data latch 170 may, in some embodiments, include conductive paths 241, transistors Q2 and Q3 and margin mode lines MM48 and MM49. As shown in FIG. 13, an application of voltage along margin mode lines MM48 and/or MM49 may enable transistors Q2 and/or Q3 to conduct current from conductive path 236 during a load operation of control data latch 170. The conduction of current through conductive paths 241 relative to magnetic elements 220 and 222 may increase the amount of current passing through transistors Q5 and Q6, respectively. Consequently, the resistance of magnetic elements 220 and/or 222 may be effectively reduced depending on whether transistors Q2 or Q3 are turned on. In general, it is beneficial to have the difference of resistances between magnetic elements in opposing states to be large enough to enable volatile portion 232 to be consistently loaded with the correct data. However, variations within magnetic elements may cause the differences in resistance between magnetic elements to be reduced to a level at which correct data may not be reliably loaded into volatile portion 232. In some cases, the difference in resistances may be reduced to a level at which data may be correctly loaded during some operations of the device, but may fail to load correct data at other times. Such a scenario may be particularly undesirable in cases in which a nonvolatile latch passes a test operation, but fails in production operations, such as those employed by a customer of the device.

Incorporating circuitry (e.g., conductive paths 241, transistors Q2 and Q3 and margin mode lines MM48 and MM49) to alter the amount of current through conductive paths 238 during a load operation of control data latch 170 may advantageously provide a manner with which to detect magnetic elements which may produce low differential resistances. In particular, conductive paths 241, transistors Q2 and Q3 and margin mode lines MM48 and MM49 may be used to decrease the resistance through magnetic elements 220 and 222 such that control data latch 170 may be tested for loading data with reduced differential resistances. In cases in which control data latch 170 correctly loads data into volatile portion 232 at such reduced differential resistances, the reliability of control data latch 170 may be more certain than in cases in which the resistances through magnetic elements 220 and 222 are not reduced. Consequently, it may be advantageous to employ margin mode circuit lines MM48 and MM49, transistors Q5 and Q6 and conductive lines 241 within control data latch 170 in some cases. In other embodiments, however, margin mode circuit lines MM48 and MM49, transistors Q5 and Q6 and conductive lines 241 may be omitted from control data latch 170 to ease the complexity of the device.

Figure 18:
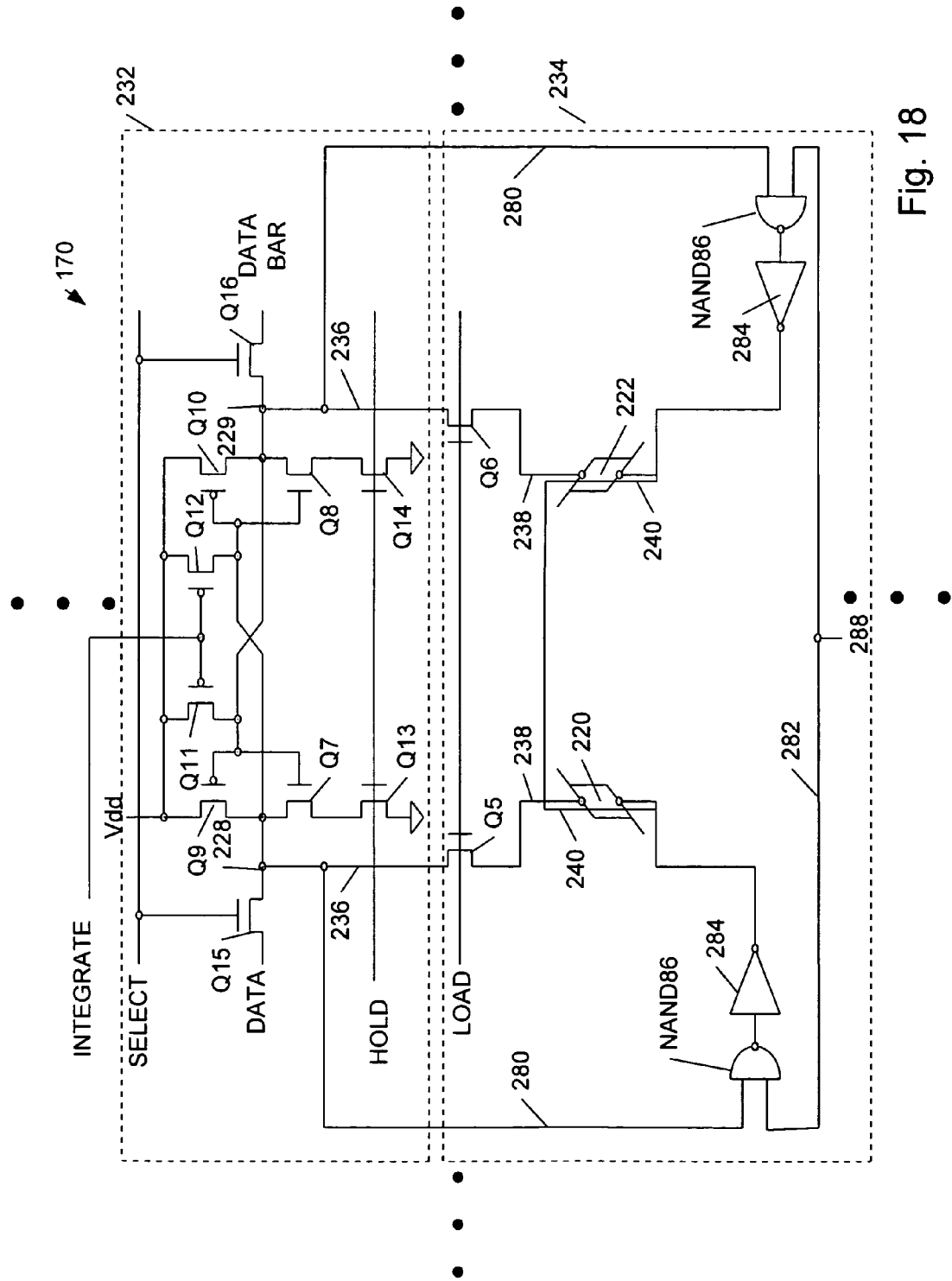
FIG. 18 illustrates an electrical schematic diagram of the latch in FIG. 13 comprising a different arrangement of circuitry.

Although control data latch 170 is discussed above in reference to loading data from magnetic elements 220 and 222 to nodes 228 and 229 within volatile portion 232, control data latch 170 may alternatively be configured to program magnetic elements 220 and 222 from data stored within volatile portion 232. An exemplary embodiment of control data latch 170 illustrating such a configuration is shown in FIG. 18. In particular, FIG. 18 illustrates control data latch 170 absent of current sources lines 242 and 244 and program transistor Q1. Instead, control data latch 170 is shown to include conductive lines 280, write enable line 282, NAND gates 286 and current drivers 284. It is noted that margin mode circuit lines MM48 and MM49, transistors Q5 and Q6 and conductive lines 241 are not shown in FIG. 18 to simplify the drawing. Such components may be included within such an embodiment of control data latch 170 or may be omitted from control data latch 170 as in the embodiment of FIG. 13.

As shown in FIG. 18, conductive lines 280 may be coupled between conductive lines 236 and NAND gates 286. In addition, write enable line 282 may be coupled to NAND gates 286 having voltage source 288. During programming, voltage applied on LOAD line may be low, turning off transistors Q5 and Q6 and floating one side of magnetic elements 220 and 222 so the elements will not be susceptible to voltage stress and breakdown. When voltage source 288 goes high, magnetic elements 220 and 222 may be programmed with current through one of current drivers 284 based on the level of voltage on nodes 228 and 229 of volatile portion 232. Such a latch configuration may be used to load from magnetic elements 220 and 222 to volatile portion 232 as well. In particular, a load operation may include bringing LOAD line high such that transistors Q5 and Q6 allow current flow to be induced through conductive paths 238. In such embodiments, voltage source 288 may be brought low such that the output nodes of current drivers 284 may serve as a virtual ground for current passing through conductive paths 238.

It will be appreciated to those skilled in the art having the benefit of this disclosure that this invention is believed to provide a variety of circuitry for an MRAM device. Methods for operating an MRAM device are also provided. Further modifications and alternative embodiments of various aspects of the invention will be apparent to those skilled in the art in view of this description. For example, the although the MRAM device described to include all of the circuitry provided herein, the MRAM device may include less than all of such circuitry. It is intended that the following claims be interpreted to embrace all such modifications and changes and, accordingly, the specification and drawings are to be regarded in an illustrative rather than a restrictive sense.

What is claimed is:

1. A magnetic random access memory device, comprising:
    an array of magnetic elements;
    a plurality of conductive lines configured to set magnetization states of the magnetic elements; and
    circuitry configured to independently vary an amount of current and a length of time current is applied to one or more of the conductive lines with respect to the temperature of the magnetic random access memory device.

2. The magnetic random access memory device of claim 1, wherein the circuitry is further configured to vary the amount of current with respect to the direction along which the current is applied.

3. The magnetic random access memory device of claim 1, wherein the circuitry is configured to apply a write pulse current along one or more of the conductive lines for a length of time sufficient to allow a source current to be measured from a voltage power supply coupled to the magnetic random access memory device during the application of the write pulse current.

4. The magnetic random access memory device of claim 1, wherein the circuitry is configured to vary current applications for write operations of the magnetic random access memory device.

5. The magnetic random access memory device of claim 1, wherein the circuitry is configured to vary current applications for read operations of the magnetic random access memory device.

6. The magnetic random access memory device of claim 5, wherein the circuitry is further configured to vary an amount of bias voltage applied along a different conductive line comprising a gate of a transistor coupled to one of the magnetic elements.

7. The magnetic random access memory device of claim 1, wherein the circuitry is further configured to terminate the current applications upon determining a power level supplied to the magnetic random access memory device is below a predetermined threshold.

8. The magnetic random access memory device of claim 1, further comprising a reprogrammable non-volatile latch which is distinct from the array of magnetic elements and configured to store parameter settings for the current applications.

9. The magnetic random access memory device of claim 1, wherein the circuitry is further configured to vary a point in time at which current is applied to the one or more conductive lines.

10. The magnetic random access memory device of claim 1, wherein the circuitry is further configured to terminate an application of current along one or more of the conductive lines before magnetization states of one or more magnetic elements selected for a write operation of the device are changed.

11. A device, comprising:
a magnetic random access memory (MRAM) array;
a first storage circuit distinct from the MRAM array, wherein the first storage circuit comprises one or more magnetic elements, and wherein the first storage circuit is configured to store, within the magnetic elements, parameter settings characterizing applications of current to operate the magnetic random access memory array; and
an alternative means by which to store parameter settings characterizing applications of current to operate the magnetic random access memory array.

12. The device of claim 11, wherein the parameter settings are settings selected for use by a customer of the device.

13. The device of claim 11, wherein the parameter settings are settings selected for testing qualitative features of the magnetic random access memory array.

14. The device of claim 11, further comprising a second storage circuit having one or more magnetic elements, wherein the second storage circuit is configured to send a control signal by which to select the first storage circuit or the alternative means to send the parameter settings to the magnetic random access memory array.

15. The device of claim 11, further comprising circuitry configured to vary one or more values of the parameter settings during an operation of the magnetic random access memory array.

16. A magnetic random access memory device, comprising:
an array of magnetic elements;
a plurality of conductive lines configured to set magnetization states of the magnetic elements; and
circuitry configured to:
terminate an application of current along one or more of the conductive lines before magnetization states of one or more magnetic elements selected for a write operation of the device are changed;
monitor a voltage level of a power supply coupled to the magnetic random access memory device; and
terminate the application of current upon determining the voltage level is below a predetermined threshold.

17. A method, comprising:
coupling a power source to a magnetic random access memory device;
writing to at least one magnetic memory cell junction within the magnetic random access memory device;
monitoring current levels supplied from the power source; and
determining a write pulse amplitude for the magnetic junction based on a difference between a current level measured during the step of writing and a current level measured not during the step of writing.

18. The method of claim 17, wherein the step of determining a write pulse amplitude for the magnetic junction comprises determining a difference between the current level measured during the step of writing and a current level measured prior to the step of writing.

19. The method of claim 17, wherein the step of determining a write pulse amplitude for the magnetic junction comprises determining a difference between the current level measured during the step of writing and a current level measured subsequent to the step of writing.

20. The method of claim 17, wherein the step of writing comprises:
raising a voltage application along an address path of the magnetic random access memory device to a level higher than a voltage of the power supply; and
applying a current along a bit line coupled to the magnetic element for more than approximately 50 ns.

21. A method, comprising:
applying an initial bias voltage on a magnetic element of a memory cell array;
altering the bias voltage incrementally;
monitoring current levels associated with the initial bias voltage and the incremental bias voltages;
determining a difference in current levels between the initial bias voltage and an incremental bias voltage associated with a level of current corresponding to a midpoint between two logic states of the magnetic element; and
classifying the magnetic element as unsatisfactory upon determining the difference is less than a predetermined level.

22. The method of claim 21, wherein the step of altering the bias voltage incrementally comprises increasing the bias voltage.

23. The method of claim 21, wherein the step of altering the bias voltage incrementally comprises decreasing the bias voltage.

* * * * *